(12) United States Patent
Miyairi et al.

(10) Patent No.: US 9,018,109 B2
(45) Date of Patent: Apr. 28, 2015

(54) THIN FILM TRANSISTOR INCLUDING SILICON NITRIDE LAYER AND MANUFACTURING METHOD THEREOF

(75) Inventors: Hidekazu Miyairi, Kanagawa (JP); Erika Kato, Kanagawa (JP); Kunihiko Suzuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 239 days.

(21) Appl. No.: 12/715,629

(22) Filed: Mar. 2, 2010

(65) Prior Publication Data

US 2010/0230677 A1    Sep. 16, 2010

(30) Foreign Application Priority Data

Mar. 10, 2009 (JP) .................. 2009-055878

(51) Int. Cl.
*H01L 21/31* (2006.01)
*H01L 21/469* (2006.01)
*H01L 29/49* (2006.01)
*H01L 29/66* (2006.01)
(Continued)

(52) U.S. Cl.
CPC ...... *H01L 29/4908* (2013.01); *H01L 29/66765* (2013.01); *H01L 29/78669* (2013.01); *H01L 29/78678* (2013.01); *H01L 29/78696* (2013.01); *H01L 27/1214* (2013.01)

(58) Field of Classification Search
CPC .............. H01L 27/1214; H01L 27/12; H01L 29/66757
USPC .................. 438/149–151, 791–792; 257/57
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |

(Continued)

FOREIGN PATENT DOCUMENTS

| | | |
|---|---|---|
| CN | 001677613 A | 10/2005 |
| CN | 001917219 | 2/2007 |

(Continued)

OTHER PUBLICATIONS

Arai, et al., "41.2: Micro Silicon Technology for Active Matrix OLED Display", SID Digest '07: SID International Symposium Digest of Technical Papers, vol. XXXVIII, pp. 1370-1373, 2007.

(Continued)

*Primary Examiner* — Lex Malsawma
*Assistant Examiner* — Eric Jones
(74) *Attorney, Agent, or Firm* — Nixon Peabody LLP; Jeffrey L. Costellia

(57) ABSTRACT

A thin film transistor in which deterioration at initial operation is not likely to be caused and a manufacturing method thereof. A transistor which includes a gate insulating layer at least whose uppermost surface is a silicon nitride layer, a semiconductor layer over the gate insulating layer, and a buffer layer over the semiconductor layer and in which the concentration of nitrogen in the vicinity of an interface between the semiconductor layer and the gate insulating layer, which is in the semiconductor layer is lower than that of the buffer layer and other parts of the semiconductor layer. Such a thin film transistor can be manufactured by exposing the gate insulating layer to an air atmosphere and performing plasma treatment on the gate insulating layer before the semiconductor layer is formed.

17 Claims, 18 Drawing Sheets

(51) Int. Cl.
*H01L 29/786* (2006.01)
*H01L 27/12* (2006.01)

(56) References Cited

U.S. PATENT DOCUMENTS

| | | | |
|---|---|---|---|
| 5,221,631 A | | 6/1993 | Ikeda et al. |
| 5,272,361 A | * | 12/1993 | Yamazaki ............... 257/66 |
| 5,311,040 A | * | 5/1994 | Hiramatsu et al. ....... 257/57 |
| 5,453,858 A | | 9/1995 | Yamazaki |
| 5,514,879 A | | 5/1996 | Yamazaki |
| 5,591,987 A | | 1/1997 | Yamazaki et al. |
| 5,600,154 A | * | 2/1997 | Shimizu et al. ......... 257/66 |
| 5,614,732 A | | 3/1997 | Yamazaki |
| 5,648,662 A | | 7/1997 | Zhang et al. |
| 5,701,167 A | | 12/1997 | Yamazaki |
| 5,766,989 A | | 6/1998 | Maegawa et al. |
| 5,825,050 A | * | 10/1998 | Hirakawa ............... 257/57 |
| 5,849,601 A | | 12/1998 | Yamazaki |
| 5,859,445 A | | 1/1999 | Yamazaki |
| 5,864,150 A | | 1/1999 | Lin |
| 5,932,302 A | | 8/1999 | Yamazaki et al. |
| 6,011,277 A | | 1/2000 | Yamazaki |
| 6,023,075 A | | 2/2000 | Yamazaki |
| 6,091,467 A | | 7/2000 | Kubo et al. |
| 6,153,893 A | | 11/2000 | Inoue et al. |
| 6,171,674 B1 | | 1/2001 | Yamazaki et al. |
| 6,183,816 B1 | | 2/2001 | Yamazaki et al. |
| 6,524,958 B2 | * | 2/2003 | Sakai et al. ............. 438/689 |
| 7,375,039 B2 | * | 5/2008 | Gambino et al. ......... 438/758 |
| 7,411,298 B2 | * | 8/2008 | Kawakami et al. ........ 257/741 |
| 7,851,285 B2 | | 12/2010 | Park |
| 7,998,800 B2 | | 8/2011 | Yamazaki |
| 8,389,343 B2 | | 3/2013 | Yamazaki |
| 2002/0055211 A1 | | 5/2002 | Sakai et al. |
| 2002/0063255 A1 | | 5/2002 | Nakanishi et al. |
| 2004/0246432 A1 | | 12/2004 | Tsuchiya et al. |
| 2005/0221568 A1 | | 10/2005 | Ishida et al. |
| 2006/0240602 A1 | | 10/2006 | Roca I Cabarrocas et al. |
| 2006/0286803 A1 | * | 12/2006 | Cole et al. .............. 438/685 |
| 2007/0040172 A1 | * | 2/2007 | Kawakami et al. ........ 257/59 |
| 2007/0040173 A1 | * | 2/2007 | Kugimiya et al. ......... 257/59 |
| 2008/0012076 A1 | * | 1/2008 | Yamazaki et al. ......... 257/347 |
| 2008/0020591 A1 | * | 1/2008 | Balseanu et al. .......... 438/761 |
| 2008/0260969 A1 | * | 10/2008 | Dussarrat et al. ......... 427/579 |
| 2009/0002591 A1 | * | 1/2009 | Yamazaki et al. ......... 349/43 |

FOREIGN PATENT DOCUMENTS

| | | |
|---|---|---|
| CN | 101290881 A | 10/2008 |
| EP | 0449539 A | 10/1991 |
| EP | 0 535 979 A2 | 4/1993 |
| EP | 1 505 174 A1 | 2/2005 |
| JP | 02-053941 | 2/1990 |
| JP | 02-053941 B2 | 11/1990 |
| JP | 03-278466 A | 12/1991 |
| JP | 04-242724 | 8/1992 |
| JP | 06-326312 | 11/1994 |
| JP | 2000-277439 | 10/2000 |
| JP | 2009-038357 A | 2/2009 |
| JP | 2009-044134 | 2/2009 |

OTHER PUBLICATIONS

Kim, et al., "42.1: A Novel Four-Mask-Count Process Architecture for TFT-LCDs", SID Digest '00: SID International Symposium Digest of Technical Papers, pp. 1006-1009, 2000.

Song, et al., "34.1 Advanced Four-Mask Process Architecture for the A-SI TFT Array Manufacturing Method", SID Digest '02: SID International Symposium Digest of Technical Papers, pp. 1038-1041, 2002.

Choi, et al., "P-16: Novel Four-Mask Process in the FFS TFT-LCD With Optimum Multiple-Slit Design Applied by Tile Use of a Gray-Tone Mask", SID Digest '05: SID International Symposium Digest of Technical Papers, pp. 284-287, 2005.

Fujiwara, et al., "Stress-Induced Nucleation of Microcrystalline Silicon From Amorphous Phase", Jpn. J. Appl. Phys., vol. 41/Part 1, pp. 2821-2828, 2002.

Kamei, et al. "A Significant Reduction of Impurity Contents in Hydrogenated Microcrystalline Silicon Films for Increased Grain Size and Reduced Defect Density", Jpn. J. Appl. Phys., vol. 37/Part 2, pp. L265-L268, 1998.

Fujiwara, et al., "Real-Time Spectroscopic Ellipsometry Studies of the Nucleation and Grain Growth Processes in Microcrystalline Silicon Thin Films", Phys. Rev. B, 63, pp. 115306-1-115306-9, 2001.

Fujiwara, et al., "Microcrystalline Silicon Nucleation Sites in the Sub-Surface of Hydrogenated Amorphous Silicon", Surface Science, 497, pp. 333-340, 2002.

Chinese Office Action (Application No. 201010139407.4; CN12224) Dated Nov. 5, 2013.

Chinese Office Action (Application No. 201010139407.4) Dated Jun. 30, 2014.

Chinese Office Action (Application No. 201010139407.4) Dated Jan. 6, 2015.

Taiwanese Office Action (Application No. 099106353) Dated Jan. 23, 2015.

* cited by examiner

Light transmittance

Light transmittance

THIN FILM TRANSISTOR INCLUDING SILICON NITRIDE LAYER AND MANUFACTURING METHOD THEREOF

BACKGROUND OF THE INVENTION

1. Field of the Invention

An embodiment of the present invention relates to a thin film transistor and a manufacturing method thereof, and further relates to a display device and an electronic device.

2. Description of the Related Art

In recent years, thin film transistors (hereinafter, referred to as TFTs) each including a thin semiconductor film (with a thickness of approximately several nanometers to several hundreds of nanometers) over a substrate having an insulating surface (e.g., a glass substrate) have been attracting attention. TFTs are widely used for ICs (integrated circuits) and electronic devices such as electro-optical devices. The development of TFTs especially as switching elements of image display devices typified by liquid crystal display devices and the like has been accelerated. In image display devices such as liquid crystal display devices, TFTs each using an amorphous semiconductor film or a polycrystalline semiconductor film are mainly used as a switching element.

The mobility of a TFT using an amorphous semiconductor film is low. In other words, the current driving capability is low. Thus, when a protection circuit is provided with a TFT using an amorphous semiconductor film, a large-sized TFT needs to be provided for adequate measure against electrostatic breakdown, which causes inhibition of a narrower frame. In addition, when the large-sized TFT is provided, parasitic capacitance between a scan line electrically connected to a gate electrode and a signal line electrically connected to a source electrode or a drain electrode is increased, which causes an increase in power consumption.

On the other hand, a TFT using a polycrystalline semiconductor film has higher mobility than a thin film transistor using an amorphous semiconductor film by two or more digits and a pixel portion of a liquid crystal display device and a driver circuit in the periphery thereof can be provided over the same substrate. However, a process of the TFT using a polycrystalline semiconductor film is more complicated than that of the TFT using an amorphous semiconductor film due to crystallization of a semiconductor film, introduction of an impurity element (doping), and the like. Therefore, there are problems of low yield and high cost. As a formation method of a polycrystalline semiconductor film, a technique is widely known in which the shape of a pulsed excimer laser beam is processed into a linear beam by an optical system and an amorphous semiconductor film is irradiated with the linear laser beam while being scanned by the linear laser beam to be crystallized.

As a switching element of an image display device, a TFT using a microcrystalline semiconductor film are known as well as the TFT using an amorphous semiconductor film and the TFT using a polycrystalline semiconductor film (see Patent Document 1).

[Reference]

[Patent Document 1] Japanese Published Patent Application No. 2009-044134

SUMMARY OF THE INVENTION

It is an object of an embodiment of the present invention to provide a TFT in which deterioration caused at initial operation is suppressed.

It is an object of an embodiment of the present invention to provide a method for manufacturing a TFT in which deterioration caused at initial operation is suppressed by simple steps.

An embodiment of the present invention is a method for manufacturing a TFT, which includes steps of forming silicon nitride layer; exposing the silicon nitride layer to an air atmosphere before forming a semiconductor layer over the silicon nitride layer; preferably exposing the silicon nitride layer to $H_2$ gas plasma or Ar gas plasma before forming the semiconductor layer over the silicon nitride layer; and forming the semiconductor layer using a crystalline semiconductor over the silicon nitride layer. Note that, here, Ar represents argon, which is the same hereinafter in this specification.

An embodiment of the present invention is a TFT including a gate insulating layer at least whose uppermost surface is a silicon nitride layer; a semiconductor layer provided over the gate insulating layer; and a buffer layer over the semiconductor layer, where the concentration of nitrogen in the semiconductor layer in the vicinity of an interface between the semiconductor layer and the gate insulating layer is lower than that of the buffer layer and other parts of the semiconductor layer. Note that, here, a value determined by secondary ion mass spectrometry (hereinafter referred to as SIMS) is used for the concentration, which is the same hereinafter in this specification.

Note that in this specification, a "film" refers to a film which is formed over an entire surface of an object. A "layer" refers to a layer which is formed by processing a film into a desired shape by patterning or the like. However, a "layer" and a "film" do not have to be strictly distinguished especially in the case of a stacked film in which a plurality of films are stacked.

A TFT in which deterioration caused at initial operation is suppressed can be obtained.

DETAILED DESCRIPTION OF THE INVENTION

Figure 1A:
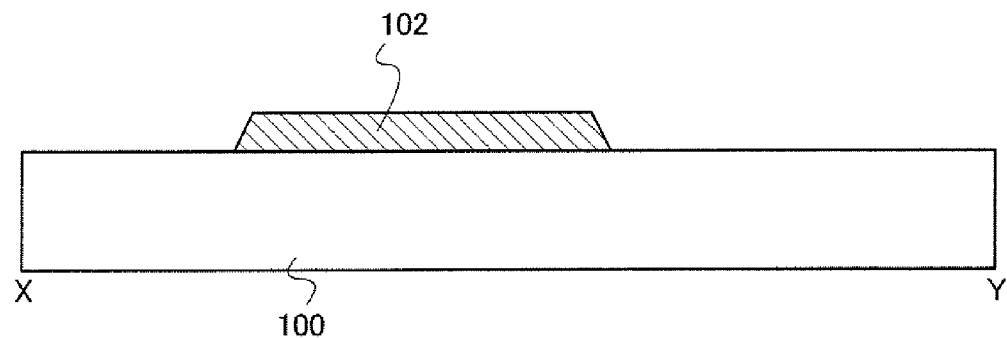
FIGS. 1A to 1C are views illustrating an example of a manufacturing method of a TFT.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. Note that in the description made with reference to the drawings, the same reference numerals are used in common for the same portions in different drawings. Note that the same hatch pattern is applied to similar parts, and the similar parts are not especially denoted by reference numerals in some cases. Note also that an insulating layer is not illustrated in a top view in some cases.

(Embodiment 1)

In Embodiment 1, a TFT that is an embodiment of the present invention and a manufacturing method thereof will be described.

Note that the TFT that is an embodiment of the present invention has a crystalline semiconductor. An n-type TFT having a crystalline semiconductor has higher carrier mobility than a p-type TFT having a crystalline semiconductor. Further, when TFTs having the same polarity are manufactured over the same substrate, the number of steps can be reduced. Therefore, a manufacturing method of an n-type TFT is described here. However, the present invention is not limited thereto.

First, a gate electrode layer 102 is formed over a substrate 100 (see FIG. 1A). As the substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance which is high enough to withstand a process temperature of this manufacturing process; and the like. Alternatively, a metal substrate of a stainless steel alloy or the like with the surface provided with an insulating layer may be used. In other words, a substrate having an insulating surface is used as the substrate 100. In the case where the substrate 100 is a mother glass, the substrate may have any size of from the first generation (e.g., 320 mm×400 mm) to the tenth generation (e.g., 2950 mm×3400 mm), and the like.

A gate electrode layer 102 may be formed using a conductive material. As the conductive material, for example, a metal material such as Mo, Ti, Cr, Ta, W, Al, Cu, Nd or Sc, or an alloy material containing the above metal material as its main component can be used. Alternatively, crystalline silicon to which an impurity element imparting one conductivity type is added may be used. Note that the gate electrode layer 102 may have a single-layer structure or a structure in which a plurality of layers are stacked. For example, a two-layer structure in which a Ti layer or a Mo layer is stacked over an Al layer or a Cu layer, or a three-layer structure in which an Al layer or a Cu layer is interposed between Ti layers or Mo layers is preferably used. Alternatively, a Ti nitride layer may be used instead of the Ti layer.

Note that, here, Mo represents molybdenum; Ti, titanium; Cr, chromium; Ta, tantalum; W, tungsten; Al, aluminum; Cu, copper; Nd, neodymium; and Sc, scandium; which are the same hereinafter in this specification.

The gate electrode layer 102 can be formed in such a manner that a conductive layer is formed over the substrate 100, using a conductive material by a sputtering method or a vacuum evaporation method; a resist mask is formed by photolithography, an inkjet method, or the like, and then the conductive layer is etched using the resist mask. Alternatively, the gate electrode layer 102 can be formed in such a manner that a conductive nanopaste of Ag, Au, Cu, or the like over the substrate 100 by an inkjet method and the conductive nanopaste is baked. Note that as a barrier metal for increasing the adhesion between the gate electrode layer 102 and the substrate 100 and preventing diffusion of a material used for forming the gate electrode layer 102 into a base, a nitride layer of any of the above metal materials may be provided between the substrate 100 and the gate electrode layer 102.

Note that it is preferable that the gate electrode layer 102 have a tapered shape because a semiconductor layer and a source wiring (a signal line) are formed over the gate electrode layer 102 in a later step. Note that a gate wiring (a scan line) can be formed at the same time in this step. Note also that the "scan line" refers to a wiring for selecting a pixel.

Figure 1B:
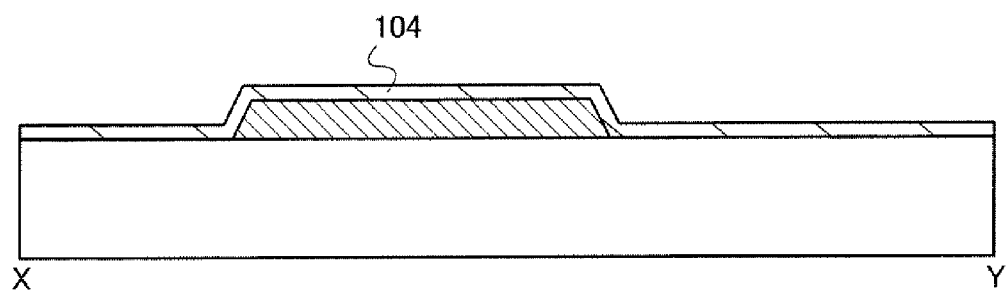

Next, a gate insulating layer 104 is formed so as to cover the gate electrode layer 102 (see FIG. 1B). The gate insulating layer 104 can be formed using silicon nitride by a CVD method, a sputtering method, or the like. Although the gate insulating layer 104 can alternatively be formed using silicon nitride oxide, silicon oxynitride, or a silicon oxide, at least a surface of the gate insulating layer 104 is formed of silicon nitride. This gate insulating layer 104 is formed to a thickness of 50 nm or more, preferably 50 nm or more and 400 nm or less, more preferably 150 nm or more and 300 nm or less. However, the present invention is not limited thereto. Note that a plasma CVD apparatus with a high frequency (e.g., 1 GHz or higher) is preferably used for forming the gate insulating layer 104, in which case a dense silicon nitride layer can be formed as the gate insulating layer 104.

Note that silicon nitride oxide contains more nitrogen than oxygen and, in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

On the other hand, silicon oxynitride contains more oxygen than nitrogen and, in the case where measurements are performed using RBS and HFS, preferably contains oxygen, nitrogen, silicon, and hydrogen at concentrations ranging from 50 at. % to 70 at. %. 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

Next, a first semiconductor film 106A is formed over the gate insulating layer 104. Note that the gate insulating layer 104 and the first semiconductor film 106A are not consecutively formed in the same treatment chamber, but the surface of the gate insulating layer 104 may be exposed to an air atmosphere and preferably subjected to plasma treatment. When the surface of the gate insulating layer 104 is exposed to an air atmosphere and subjected to plasma treatment, the nitrogen concentration of the surface of the gate insulating layer 104 can be effectively reduced. Here, the gate insulating layer 104 is exposed to an air atmosphere for about two seconds or more and ten minutes or less, preferably one minute or more and five minutes or less, and, for example, an Ar gas or an $H_2$ gas can be used for the plasma treatment. Note that it is preferable to consecutively form the first semiconductor film 106A, a second semiconductor film 108A, and an impurity semiconductor film 110A in the same treatment chamber. The reason for the above is as follows. When the surface of the first semiconductor film 106A or a surface of the second semiconductor film 108A is exposed to an air atmosphere after the formation of the first semiconductor film 106A and before the formation of the impurity semiconductor film 110A, the first semiconductor film 106A or the second semiconductor film 108A is oxidized or nitrided and a silicon oxide layer or a silicon nitride layer is formed at an interface between the first semiconductor film 106A and the second semiconductor film 108A or an interface between the second semiconductor film 108A and the impurity semiconductor film 110A, which contributes to an decrease in on current.

Figure 18:
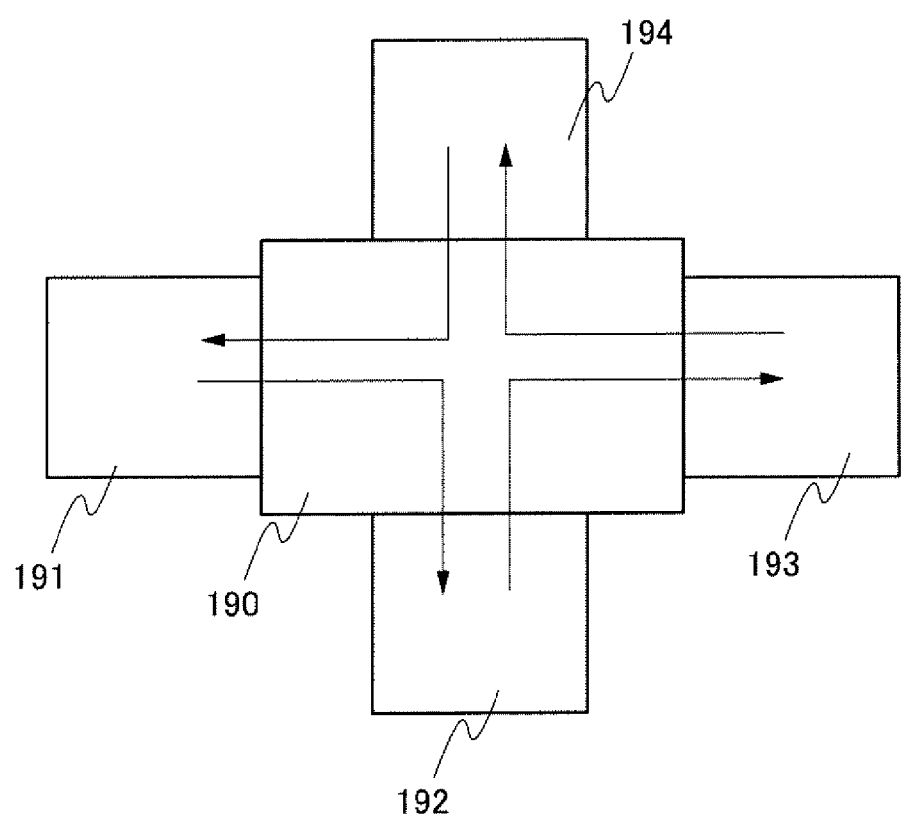
FIG. 18 is a view for illustrating an example of a manufacturing method of a TFT.

A multi-chamber plasma CVD apparatus may be used in order to expose the gate insulating layer 104 to an air atmosphere and perform plasma treatment after the exposure as described above. FIG. 18 is an example of a schematic view of a multi-chamber plasma CVD apparatus. In the multi-chamber plasma CVD apparatus illustrated in FIG. 18, a load/unload chamber 191, a first treatment chamber 192, a second treatment chamber 193, and a third treatment chamber 194 are connected to a common chamber 190. Note that the gases in the common chamber 190, the load/unload chamber 191, the first treatment chamber 192, the second treatment chamber 193, and the third treatment chamber 194 are evacuated to keep the inside in a vacuum state (preferably a high-vacuum state).

First, the substrate is carried into the load/unload chamber 191, and the gas in the load/unload chamber 191 is exhausted. After that, the substrate is carried into the common chamber 190, and then carried from the common chamber 190 to the first treatment chamber 192.

The gate insulating layer 104 is formed in the first treatment chamber 192.

The substrate over which the gate insulating layer 104 has been formed is carried into the common chamber 190 and, after that, carried into the second treatment chamber 193. The second treatment chamber 193 is a treatment chamber for exposing the gate insulating layer 104 to an air atmosphere. The second treatment chamber 193 into which the substrate is carried is opened to the air. After the gate insulating layer 104 is exposed to the air in the second treatment chamber 193, the gas in the second treatment chamber 193 is exhausted again.

The substrate having the gate insulating layer 104 which has been exposed to an air atmosphere is carried into the common chamber 190 and, after that, carried into the third treatment chamber 194. The third treatment chamber 194 is a treatment chamber for performing plasma treatment on the gate insulating layer 104. The substrate having the gate insulating layer 104 which has been subjected to the plasma treatment in the third treatment chamber 194 is carried into the common chamber 190.

The structure of the multi-chamber plasma CVD apparatus is not limited to the above-described structure. For example, the load/unload chamber 191 may also serves as the second treatment chamber 193. Alternatively, the first treatment chamber 192 may also serves as the third treatment chamber 194. In other words, the plasma treatment performed on the gate insulating layer 104 may be performed by a plasma CVD apparatus.

In this embodiment, a semiconductor layer has a stacked structure in which the second semiconductor film 108A is provided over the first semiconductor film 106A, and the first semiconductor film 106A may be provided using a semiconductor layer having higher mobility than the second semiconductor film 108A. Note that a first semiconductor layer 106 formed of the first semiconductor film 106A serves as a channel formation region and a second semiconductor layer 108B formed of the second semiconductor film 108A serves as a buffer layer. In the first semiconductor film 106A, crystal grains including a crystalline semiconductor are dispersed in the semiconductor layer having an amorphous structure (see FIG. 4).

Figure 4:
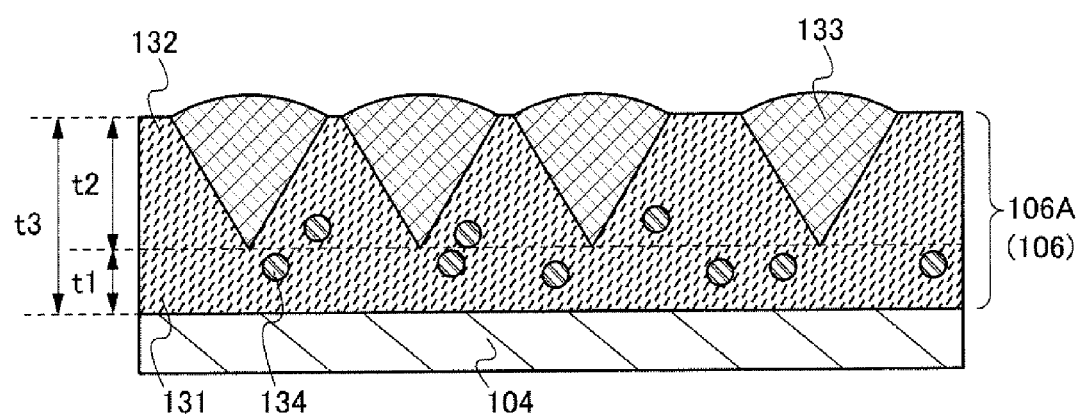
FIG. 4 is a view illustrating an example of a semiconductor layer.

The first semiconductor film 106A includes a first region 131 and a second region 132 (see FIG. 4). The first region 131 has an amorphous structure and minute crystal grains 134. The second region 132 has a plurality of dispersed crystal grains 133, the minute crystal grains 134, and an amorphous structure which fills a space between the plurality of crystal grains 133 and the minute crystal grains 134. The first region 131 is provided on the gate insulating layer 104 and has a thickness t1 from an interface with the gate insulating layer 104. The second region 132 is provided on the first region 131 and has a thickness t2 from an interface with the first region 131. In other words, nuclei generation positions (origins) of the crystal grains 133 are adjusted in a thickness direction of the first semiconductor film 106A so that they can be present at a distance of t1 away from the interface between the first region 131 and the gate insulating layer 104. The nuclei generation positions of the crystal grains 133 are determined by the concentration of impurity elements which are included in the first semiconductor film 106A and suppress generation of crystal nuclei. As an example of the impurity element which suppresses generation of crystal nuclei, nitrogen can be given. Here, nitrogen is supplied from the gate insulating layer 104.

The crystal grains 133 have inverted conical or inverted pyramidal shapes. The "inverted conical or inverted pyramidal shape" here refers to a three-dimensional shape and is constructed by (i) a base which is constructed by a plurality of planes and (ii) lines linking the periphery of the base and a vertex which is located outside the base, wherein the vertex exists on the substrate 100 side. In other words, the "inverted-conical or inverted-pyramidal shape" refers to a shape of the crystal grain 126 which grows substantially radially in a direction in which the first semiconductor film 106A is deposited, from a position away from the interface between the gate insulating layer 104 and the first semiconductor film 106A (preferably in a region which does not reach a source region and a drain region). Each of crystal nuclei formed in a dispersed manner grows along crystal direction at the same time as formation of the first semiconductor film 106A, whereby the crystal grains 133 start to grow from the crystal nuclei as an origin so as to spread in an in-plane direction of a plane perpendicular to a direction of crystal growth. The semiconductor layer has such crystal grains, whereby on current thereof can be made higher than that of an amorphous semiconductor. Note that the crystal grains 133 includes a single crystal or a twin crystal.

As described above, the crystal grains are dispersed. The nuclei generation density of the crystals may be adjusted so that the crystal grains are dispersed.

Note that crystal growth is suppressed when the impurity elements which suppress generation of the crystal nuclei exist at a high concentration (the concentration measured by SIMS is approximately $1\times10^{20}/cm^3$) as described above.

Note that the mode of the first semiconductor film 106A which is described here is an example and the present invention is not limited thereto.

The first region 131 of the first semiconductor film 106A includes the amorphous structure and the minute crystal grains 134. Further, the first region 131 has low energy at an urbach edge measured by constant photocurrent method (CMP) or photoluminescence spectroscopy and a small number of absorption spectra of defects, as compared to a conventional amorphous semiconductor layer. Accordingly, it can be said that the first region 131 is a semiconductor film having a high level of orderliness in which the number of defects is small and a tail slope of a level at a band edge of a valence band is steep, as compared to a conventional amorphous semiconductor. Note that a peak region of spectrum measured by low temperature photoluminescence spectroscopy of the first semiconductor film 106A is 1.31 eV or more and 1.39 eV or less. Note that a peak region of spectrum measured by low temperature photoluminescence spectroscopy of the microcrystalline semiconductor (e.g., microcrystalline silicon) is 0.98 eV or more and 1.02 eV or less.

Here, the second semiconductor film 108A serves as a high resistance region, and therefore can reduce off current of a TFT and can improve switching characteristics. When a TFT with high switching characteristics is used as, for example, a switching element of a liquid crystal display device, contrast of the liquid crystal display device can be improved. Note that the second semiconductor film 108A preferably includes an NH group or an $NH_2$ group. When the second semiconductor film 108A includes an NH group, dangling bonds can be cross-linked, or when the second semiconductor film 108A includes an $NH_2$ group, dangling bonds can be terminated; accordingly, on current can be increased with off current suppressed. Note that an $NH_3$ (ammonia) gas may be contained in a gas used for forming the second semiconductor film 108A so that an NH group or an $NH_2$ group is included in the second semiconductor film 108A.

The second semiconductor film 108A preferably includes an amorphous structure and minute crystal grains. In other words, it can be said that the second semiconductor film 108A preferably has the same quality as the first region 131 included in the first semiconductor film 106A. The second semiconductor film 108A has low energy at an urbach edge measured by constant photocurrent method (CMP) or photoluminescence spectroscopy and a small number of absorption spectra of defects, as compared to a conventional amorphous semiconductor layer. Accordingly, it can be said that the first region 131 is a semiconductor film having a high level of orderliness in which the number of defects is small and a tail slope of a level at a band edge of a valence band is steep, as compared to a conventional amorphous semiconductor. Such a semiconductor film can be formed under conditions similar to those of formation of a crystalline semiconductor film and by making a source gas contain nitrogen.

Note that the second semiconductor film 108A is not limited to the above description and may be formed using an amorphous semiconductor. In other words, the second semiconductor film 108A may be formed using a semiconductor material having low carrier mobility than at least the first semiconductor film 106A. Even in the case where the second semiconductor film 108A is formed of an amorphous semiconductor, an NH group or an $NH_2$ group may be included.

An impurity element imparting p-type conductivity may be added to the first semiconductor film 106A which serves as a channel formation region of a TFT at the same time as or after the formation of the first semiconductor film 106A to control threshold voltage $V_{th}$. As the impurity element imparting p-type conductivity, for example, boron can be given, and a gas containing an impurity element, such as $B_2H_6$ or $BF_3$, may be mixed into silicon hydride at a proportion of 1 ppm to 1000 ppm, preferably, 1 ppm to 100 ppm. The concentration of boron in the first semiconductor film 106A may be, for example, $1\times10^{14}/cm^3$ to $6\times10^{16}/cm^3$.

Note that the first semiconductor film 106A may be formed to a thickness of 2 nm or more and 60 nm or less, preferably 10 nm or more and 30 nm or less. When the thickness of the first semiconductor film 106A is in the range of from 2 nm to 60 nm, a TFT can be made to operate as a full depletion type TFT. Note that the second semiconductor film 108A may be formed to a thickness of 10 nm or more and 500 nm or less. The thicknesses of the first semiconductor film 106A and the second semiconductor film 108A can be adjusted by a flow rate of $SiH_4$ (silane) and formation time.

Note that it is preferable that an impurity element imparting one conductivity type, such as phosphorus or boron, be not contained in the second semiconductor film 108A. In the case where phosphorus, boron or the like is contained in the second semiconductor film 108A, the concentration of phosphorus, boron or the like may be adjusted to be lower than a lower detection limit of SIMS. For example, in the case where boron is contained in the first semiconductor film 106A and phosphorus is contained in the second semiconductor film 108A, a PN junction is formed between the first semiconductor film 106A and the second semiconductor film 108A. In addition, in the case where boron is contained in the second semiconductor film 108A and phosphorus is contained in the impurity semiconductor film 110A, a PN junction is formed between the second semiconductor film 108A and the impurity semiconductor film 110A. Further, when both boron and phosphorus are contained in the second semiconductor film 108A, a recombination center is generated, which contributes to generation of leakage current. Thus, when the second semiconductor film 108A which does not contain an impurity element such as phosphorus or boron is provided between the impurity semiconductor film 110A and the first semiconductor film 106A, the impurity element can be prevented from entering the first semiconductor film 106A which serves as a channel formation region.

Source and drain regions 110 formed of the impurity semiconductor film 110A are provided for ohmic contact between the second semiconductor layer 108 and source and drain electrode layers 112. Such an impurity semiconductor film 110A can be formed by making an impurity element imparting one conductivity type be contained in a source gas. In the case where a TFT having n-type conductivity is manufactured, for example, phosphorus may be added as the impurity element and a gas containing an impurity element imparting an n-type conductivity, such as $PH_3$, may be added to hydrogenated silicon to form the impurity semiconductor film 110A. In the case where a TFT having p-type conductivity, boron may be added as the impurity element, and a gas containing an impurity element imparting a p-type conductivity, such as $B_2H_6$, may be added to hydrogenated silicon to form the impurity semiconductor film 110A. There is no particular limitation on the crystallinity of the impurity semiconductor film 110A which becomes the source and drain regions 110. The impurity semiconductor film 110A may be formed using either a crystalline semiconductor or an amorphous semiconductor, but preferably formed using a crystalline semiconductor because on current is increased when the source and drain regions 110 are formed using a crystalline semiconductor. Accordingly, the impurity semiconductor film 110A may be formed under conditions similar to those of the first semiconductor film 106A. Note that the impurity semiconductor film 110A may be formed to a thickness of 2 nm or more and 60 nm or less.

Here, the formation of from the first semiconductor film 106A up to and including the source and drain regions 110 is described with reference to a schematic view of a plasma CVD apparatus (see FIG. 5) used for the formation and a time chart.

Figure 5:
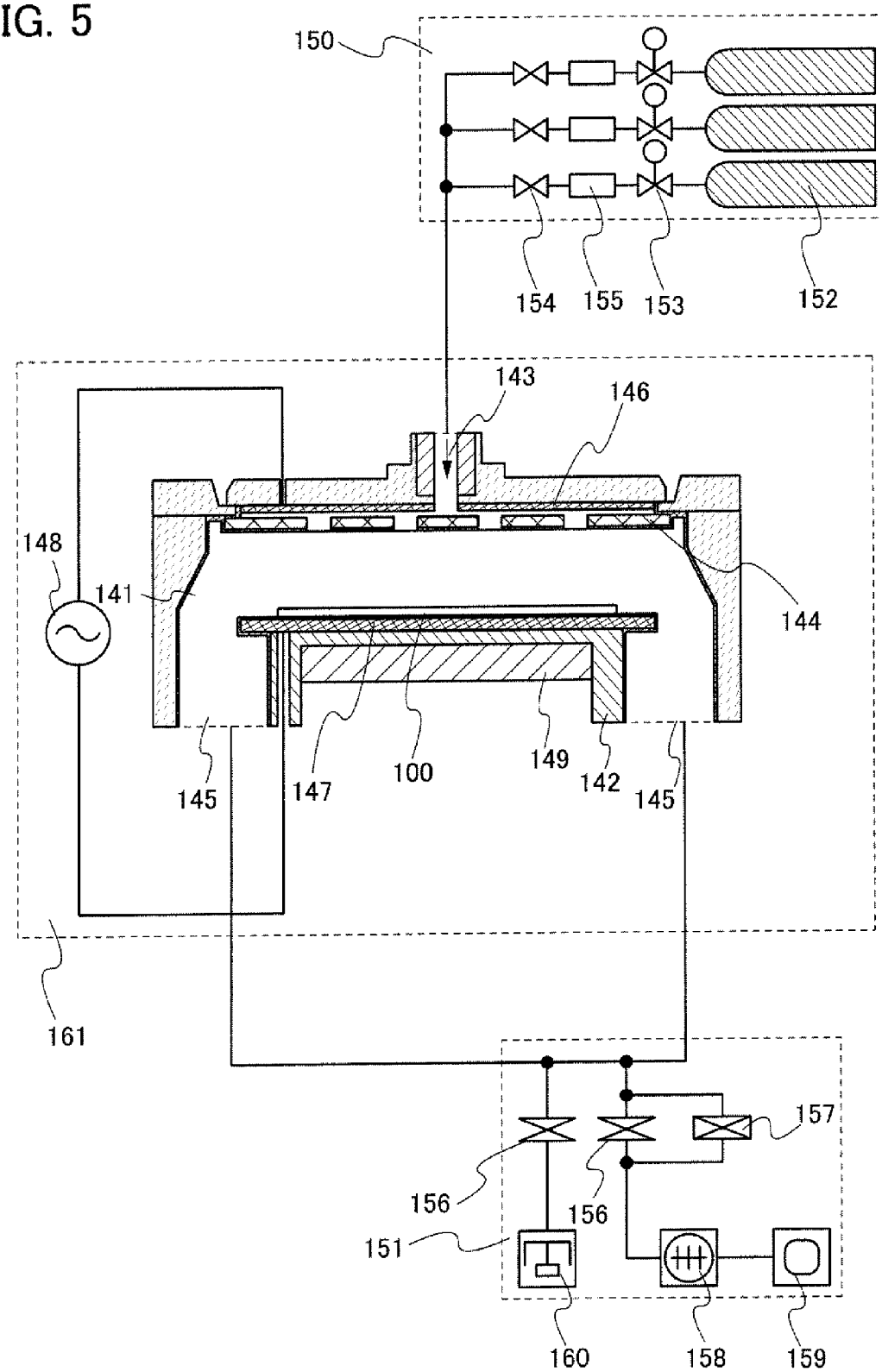
FIG. 5 is a view illustrating an example of a plasma CVD apparatus.

A plasma CVD apparatus 161 illustrated in FIG. 5 is connected to a gas supply unit 150 and an exhaust unit 151 and includes a treatment chamber 141, a stage 142, a gas supply portion 143, a shower plate 144, an exhaust port 145, an upper electrode 146, a lower electrode 147, an alternate-current power source 148, and a temperature controller 149.

The treatment chamber 141 is formed using a material having rigidity and the inside thereof can be evacuated to a vacuum. The treatment chamber 141 is provided with the upper electrode 146 and the lower electrode 147. Note that in FIG. 5, a structure of a capacitive coupling type (a parallel plate type) is illustrated; however, another structure such as a structure of an inductive coupling type may be used, as long as plasma can be produced in the treatment chamber 141 by application of two or more kinds of high-frequency electric power.

When treatment is performed with the plasma CVD apparatus illustrated in FIG. 5, a given gas is introduced from the gas supply portion 143. The introduced gas is introduced into the treatment chamber 141 through the shower plate 144. When high-frequency power is supplied with the alternate-current power source 148 connected to the upper electrode 146 and the lower electrode 147 to excite the gas in the treatment chamber 141, plasma is generated. Note that the gas in the treatment chamber 141 is exhausted through the exhaust port 145 which is connected to a vacuum pump and plasma treatment can be performed with an object heated by the temperature controller 149.

The gas supply unit 150 includes a cylinder 152 which is filled with a reaction gas, a pressure adjusting valve 153, a stop valve 154, a mass flow controller 155, and the like. The treatment chamber 141 includes a shower plate between the upper electrode 146 and the substrate 100. The shower plate is processed into a plate-like shape and provided with a plurality of pores. A reaction gas introduced through the gas supply portion 143 is introduced into the treatment chamber 141 through a hollow structure inside the upper electrode 146 and through pores of the shower plate.

The exhaust unit 151 which is connected to the treatment chamber 141 has a function of vacuum evacuation and a function of controlling the pressure inside the treatment chamber 141 to be maintained at a predetermined level when a reaction gas is made to flow. The exhaust unit 151 includes in its structure a butterfly valve 156, a conductance valve 157, a turbo molecular pump 158, a dry pump 159, and the like. In the case where the butterfly valve 156 and the conductance valve 157 are arranged in parallel, when the butterfly valve 156 is closed to operate the conductance valve 157 and the evacuation speed of the reaction gas is controlled, and thus the pressure in the treatment chamber 141 can be kept in a predetermined range. Moreover, when the butterfly valve 156 having higher conductance is opened, the exhaust velocity in the treatment chamber 141 can be increased.

In the case where ultra-high vacuum evacuation up to a pressure lower than $10^{-5}$ Pa is performed on the treatment chamber 141, a cryopump 160 is preferably used together. Alternatively, in the case where exhaust is performed up to an ultra-high vacuum, the inner wall of the treatment chamber 141 may be polished into a mirror surface, and the treatment chamber 141 may be provided with a heater for baking in order to reduce gas discharge from the inner wall.

Note that as illustrated in FIG. 5, when precoating treatment is performed so that a film is formed (deposited) so as to cover the entire inner wall of the treatment chamber 141, it is possible to prevent impurity elements attached to the inner wall of the treatment chamber 141 or impurity elements for forming the inner wall of the treatment chamber 141 from entering an element.

Note that for plasma to be generated, for example, RF (13.56 MHz, 27 MHz) plasma, VHF (30 MHz to 300 MHz) plasma, or microwave (2.45 GHz) plasma can be used. In addition, when plasma is generated, pulsed discharge is preferably used.

Note that a pretreatment chamber may be connected to the plasma CVD apparatus. When a substrate is preheated in the pretreatment chamber before the film formation, heating time needed before the film formation in each treatment chamber can be shortened, and accordingly throughput can be increased.

Note that the use of a multi-chamber plasma CVD apparatus as the plasma CVD apparatus allows a film of one kind or films with similar kinds of compositions to be formed in each chamber. Therefore, stacked films can be formed without interfaces being contaminated by a residue of formed films or an impurity element floating in the air.

Note that the inside of the treatment chamber 141 of the plasma CVD apparatus may be cleaned with fluorine radicals. Note also that a protection film is preferably formed in the treatment chamber 141 before the film formation. In the above-described step, the protection film (a silicon nitride film) can be formed on the inner wall of the treatment chamber by forming the film which serves as the gate insulating layer 104.

Next, steps of from the formation of the film which serves as the gate insulating layer 104 up to and including the formation of the impurity semiconductor film are described with reference to the time chart illustrated in FIG. 6.

Figure 6:
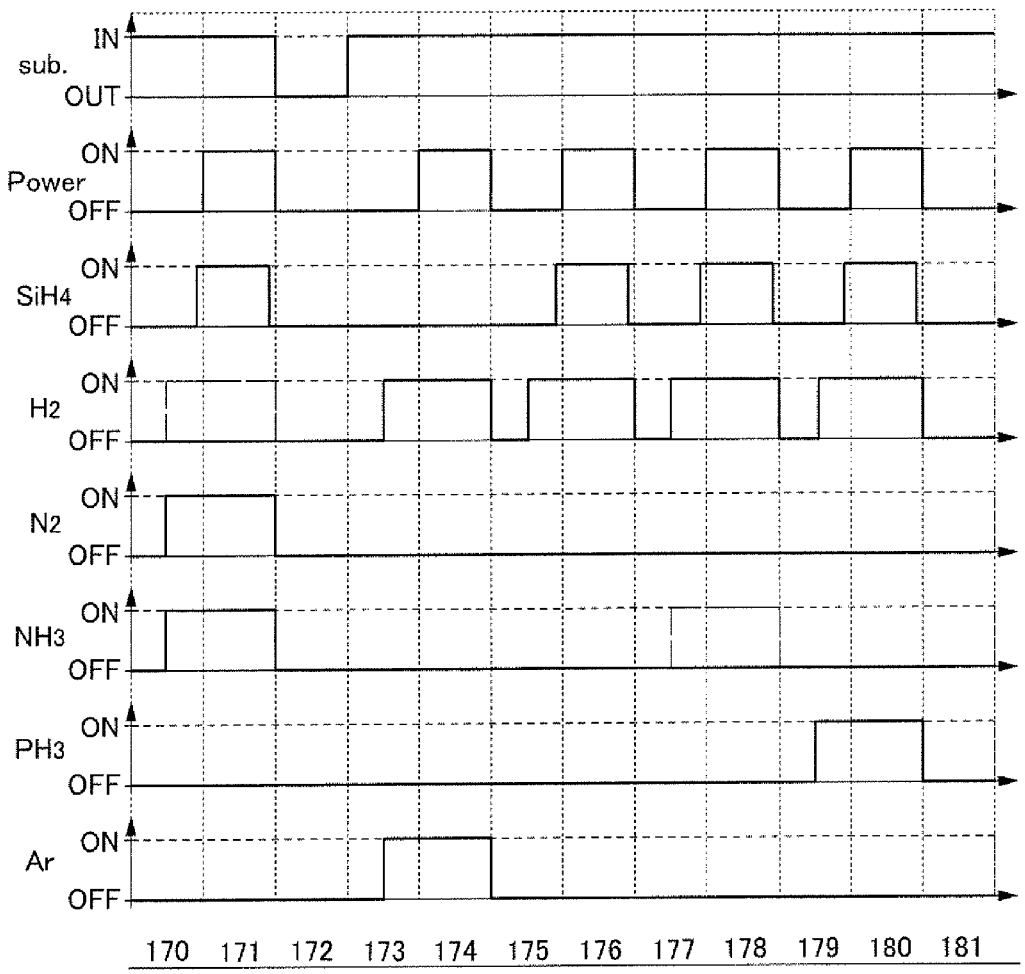
FIG. 6 is a time chart illustrating an example of a manufacturing method of a TFT.

First, the substrate over which the gate electrode layer 102 is provided is heated in the treatment chamber 141 of the plasma CVD apparatus, and source gases used for forming a silicon nitride film is introduced into the treatment chamber 141 (pretreatment 170 in FIG. 6). Here, as an example, a $SiH_4$ gas, an $H_2$ gas, an $N_2$ gas, and an $NH_3$ gas are introduced as source gases at flow rates of 40 sccm, 500 sccm, 550 sccm, and 140 sccm, respectively, and are stabilized. In addition, plasma discharge is performed under the following conditions: the pressure in the treatment chamber 141 is 100 Pa; the substrate temperature is 280° C.; the RF power source frequency is 13.56 MHz; and the electric power is 370 W. Thus, a silicon nitride film with a thickness of about 300 nm is formed. After that, only the introduction of the $SiH_4$ gas is stopped, and after several seconds (five seconds, here), the plasma discharge is stopped (silicon nitride film formation 171 in FIG. 6). Note that either the $N_2$ gas or the $NH_3$ gas may be used, and in the case of mixing the gases to be used, the flow rates of the gases are preferably adjusted as appropriate. Alternatively, the $H_2$ gas is not necessarily introduced. After that, the substrate is carried out of the treatment chamber 141, and the surface of the silicon nitride film is exposed to an air atmosphere (air exposure 172 in FIG. 6). After the exposure to an air atmosphere, the substrate is carried into the treatment chamber 141 again.

Next, the source gases in the treatment chamber 141, which are used for forming the silicon nitride film, are exhausted, and source gases which are to be used for plasma treatment are introduced into the treatment chamber 141 (gas replacement 173 in FIG. 6). After that, the plasma treatment is performed on the surface of the silicon nitride film (plasma treatment 174 in FIG. 6). Here, as an example, for the plasma treatment, an Ar gas and an $H_2$ gas are introduced at flow rates of 1500 sccm and 1500 sccm, respectively, and are stabilized. In addition, plasma discharge is performed under the following conditions: the pressure in the treatment chamber 141 is 280 Pa; the substrate temperature is 280° C.; the RF power source frequency is 13.56 MHz; and the electric power is 370 W.

Note that, although the gases in the treatment chamber 141 are replaced after the surface of the silicon nitride film is exposed to an air atmosphere here, the present invention is not limited thereto. As long as the plasma treatment is performed after the surface of the silicon nitride film is exposed to an air atmosphere, for example, the substrate may be carried out of the treatment chamber 141 after the gases in the treatment chamber 141 are replaced.

Next, the gases used for the plasma treatment were exhausted, and source gases used for forming a semiconductor film are introduced into the treatment chamber 141 (gas replacement 175 in FIG. 6).

Next, in this embodiment, a silicon film is formed over the entire surface of the silicon nitride film. First, source gases used for forming the silicon film are introduced into the treatment chamber 141. Here, as an example, a $SiH_4$ gas, an $H_2$ gas, and an Ar gas are introduced as source gases at flow rates of 10 sccm, 1500 sccm, and 1500 sccm, respectively, and are stabilized. In addition, plasma discharge is performed under the following conditions: the pressure in the treatment chamber 141 is 280 Pa; the substrate temperature is 280° C.; the RF power source frequency is 13.56 MHz; and the electric power is 50 W. Thus, the silicon film is formed as the first semiconductor film 106A. After that, in a manner similar to that of the above silicon nitride film or the like, only the introduction of the $SiH_4$ gas is stopped, and several seconds later (five seconds, here), plasma discharge is stopped (silicon film formation 176 in FIG. 6). After that, these gases are exhausted, and gases used for forming the second semiconductor film 108A are introduced (gas replacement 177 in FIG. 6). Note that without limitation thereto, the gas replacement is not necessarily performed.

In the above example, with regard to the source gases used for forming the silicon film, the flow rate of $H_2$ is 150 times as high as that of a $SiH_4$ gas; therefore, silicon is deposited gradually. Since at least the uppermost layer of the gate insulating layer 104, which is in contact with the semiconductor layer, has silicon nitride in this embodiment, a large amount of nitrogen exists on the surface of the gate insulating layer 104. As described above, nitrogen suppresses generation of silicon crystal nuclei. Therefore, at the early stage of formation of the film, silicon crystal nuclei are not likely to be generated. This layer which is formed at the early stage of the formation of the silicon film is the first region 131 illustrated in FIG. 4. Since the semiconductor film which serves as the first semiconductor film 106A is formed under certain conditions, the first region 131 and the second region 132 are formed under the same film formation conditions. Formation of the first semiconductor film 106A proceeds with the nitrogen concentration reduced, and crystal nuclei are generated when the nitrogen concentration falls below (or reaches) a given value. After that, the crystal nuclei grow to form the crystal grains 133.

Next, the second semiconductor film 108A is formed over the entire surface of the first semiconductor film 106A. The second semiconductor film 108A is processed in a later step to form the second semiconductor layer 108. First, the source gases used for forming the second semiconductor film 108A are introduced into the treatment chamber 141. Here, as an example, a $SiH_4$ gas, an $H_2$ gas, and an $NH_3$ gas diluted with $H_2$ to 1000 ppm are introduced as source gases at flow rates of 20 sccm, 1475 sccm, and 25 sccm, respectively, and are stabilized. In addition, plasma discharge is performed under the following conditions: the treatment chamber 141 is 280 Pa; the substrate temperature is 280° C.; the RF power source frequency is 13.56 MHz; and the electric power is 50 W. Thus, the second semiconductor film 108A is formed of silicon. After that, in a manner similar to that of the silicon nitride film and the like described above, only the introduction of the $SiH_4$ gas is stopped, and after several seconds (five seconds, here), the plasma discharge is stopped (buffer film formation 178 in FIG. 6). Since by the introduction of the $NH_3$ gas into the treatment chamber 141, generation of crystal nuclei can be suppressed and the buffer film including small proportion of crystals can be formed, off current can be decreased. After that, these gases are exhausted, and gases used for forming the impurity semiconductor film 110A containing an impurity element serving as a donor are introduced (gas replacement 179 in FIG. 6).

Next, the impurity semiconductor film 110A containing an impurity element serving as a donor is formed over the entire surface of the second semiconductor film 108A. In a later step, the impurity semiconductor film 110A including an impurity element serving as a donor is patterned into the source and drain regions 110. First, source gases used for forming the impurity semiconductor film 110A including an impurity element serving as a donor are introduced into the treatment chamber 141. Here, as an example, a $SiH_4$ gas and a mixed gas in which $PH_3$ (phosphine) is diluted with an $H_2$ gas to 0.5 vol % are introduced as the source gases at flow rates of 100 sccm and 170 sccm, respectively, and are stabilized. In addition, plasma discharge is performed under the following conditions: the pressure in the treatment chamber 141 is 170 Pa; the substrate temperature is 280° C.; the RF power source frequency is 13.56 MHz; and the electric power is 60 W. Thus, the impurity semiconductor film 110A containing an impurity element serving as a donor is formed. After that, in a manner similar to that of the silicon nitride film and the like described above, only the introduction of the $SiH_4$ is stopped, and after several seconds (five seconds, here), the plasma discharge is stopped (impurity semiconductor film formation 180 in FIG. 6). After that, these gases are exhausted (exhaust 181 in FIG. 6). Note that the flow rate ratio of the $SiH_4$ gas to the $H_2$ gas, which are used for forming the impurity semiconductor film 110A containing an impurity element serving as a donor, is preferably set at substantially the same as that of the first semiconductor film 106A, in which case a crystalline semiconductor film containing an impurity element serving as a donor can be formed.

Figure 1C:
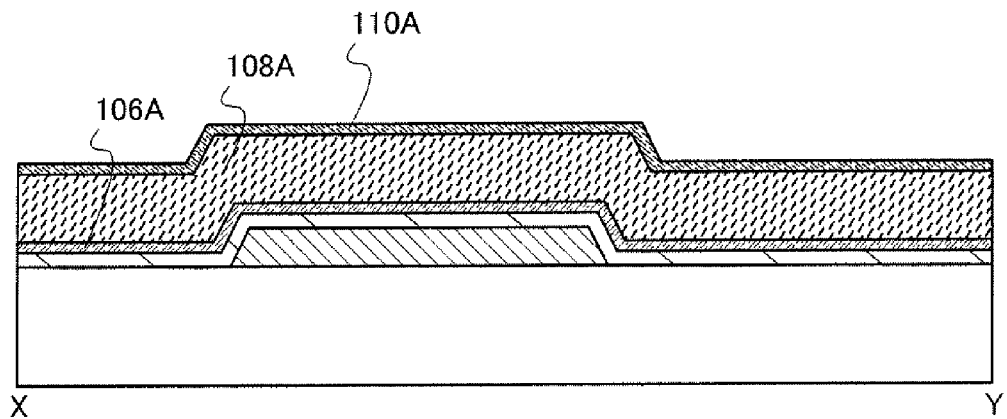

As described above, the formation of from the gate insulating layer 104 up to and including the impurity semiconductor film 110A can be perfolined (see FIG. 1C).

Here, the result of measurement by SIMS performed on the first semiconductor film 106A formed under the above conditions is described.

Figure 7:
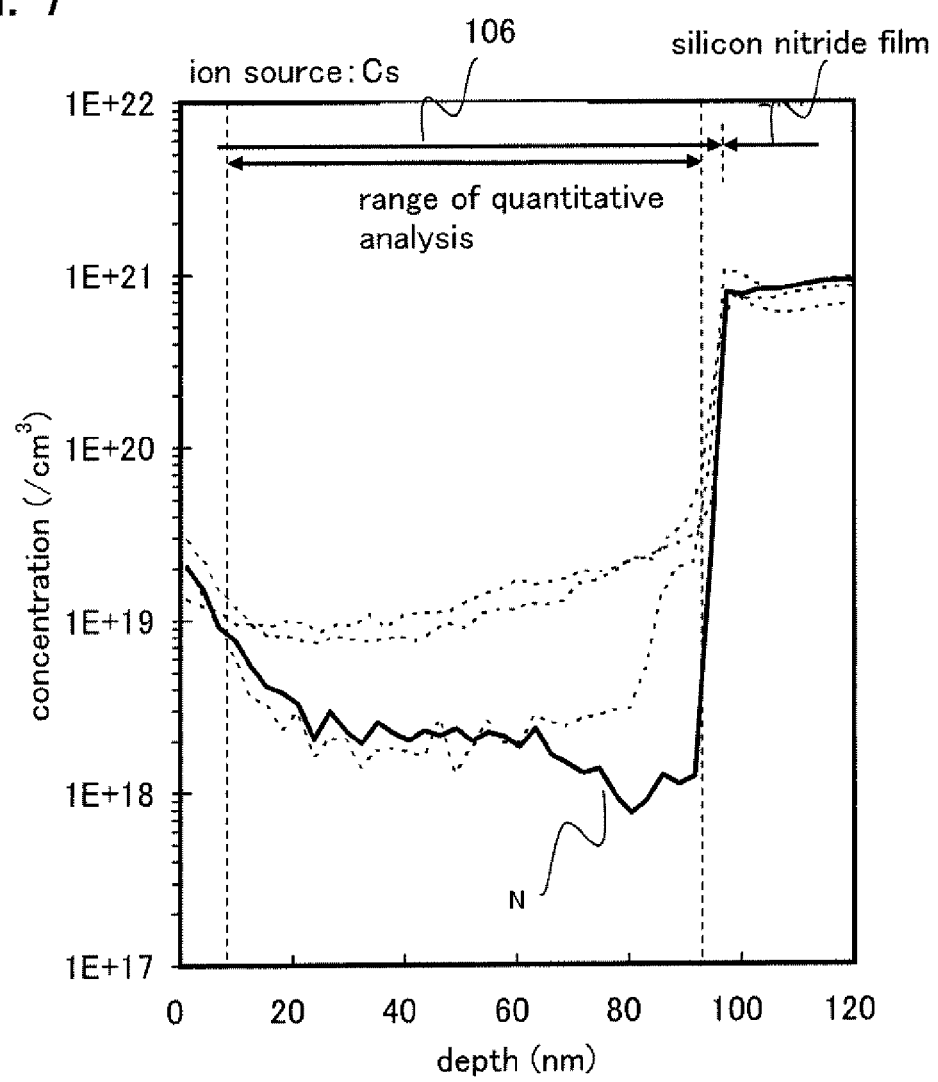
FIG. 7 is a graph illustrating a SIMS measurement result of a gate insulating layer and a semiconductor layer.

The solid line in FIG. 7 represents nitrogen concentration obtained by an analysis by SIMS performed on a sample in which the first semiconductor film 106A is formed over the silicon nitride film formed as described above (that is, by both the air exposure and the plasma treatment).

The dotted lines in FIG. 7 each represent nitrogen concentration obtained by an analysis by SIMS performed on a sample which is formed without performing either exposure of the silicon nitride film to an air atmosphere or the plasma treatment or both of them.

According to FIG. 7, the concentration of nitrogen in the first semiconductor film 106A in the vicinity of an interface between the silicon nitride film and the first semiconductor film 106A can be kept low by the above-described formation of from the silicon nitride film up to and including the first semiconductor film 106A (that is, the formation by both the air exposure and (preferably) the plasma treatment on the silicon nitride film). This region in the vicinity of the interface may be present in a region located at a depth of 3 nm or more and 100 nm or less from the interface, preferably 5 nm or more and 50 nm or less, more preferably 5 nm or more and 30 nm or less. Note that the concentration of nitrogen in this region is preferably as low as possible. The concentration is preferably less than $1 \times 10^{19}/cm^3$, more preferably less than $1 \times 10^{18}/cm^3$.

Figure 2A:
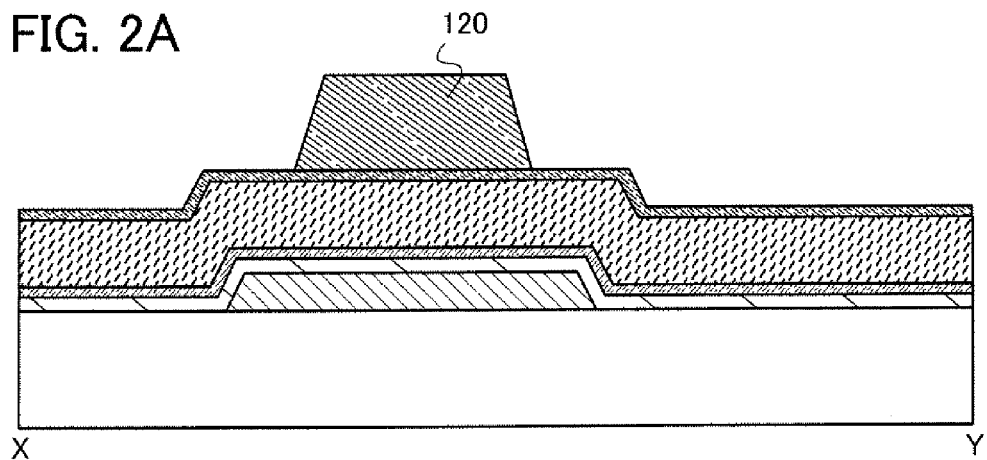
FIGS. 2A to 2C are views illustrating the example of the manufacturing method of the TFT.

Next, a resist mask 120 is formed over the impurity semiconductor film 110A (see FIG. 2A). The resist mask 120 can be fainted by photolithography. Alternatively, the resist mask 120 may be formed by an inkjet method or the like.

Figure 2B:
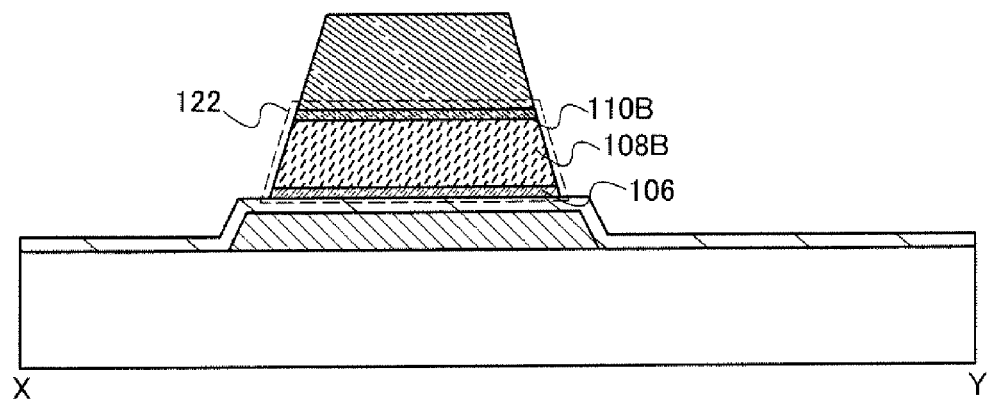

Next, the first semiconductor film 106A, the second semiconductor film 108A, and the impurity semiconductor film 110A are processed by etching using the resist mask 120. By this treatment, the first semiconductor film 106A, the second semiconductor film 108A, and the impurity semiconductor film 110A are separated corresponding to each element, so that a stacked body 122 including the first semiconductor layer 106, the second semiconductor layer 108B, and the impurity semiconductor layer 110B is formed (see FIG. 2B). After that, the resist mask 120 is removed.

This etching is preferably performed so that the stacked body 122 including the first semiconductor layer 106, the second semiconductor layer 108B, and the impurity semiconductor layer 110B can have a tapered shape. The taper angle is from 30° or more and 90° or less, preferably from 40° or more and 80° or less. With the tapered shape, coverage by a layer which is formed over these layers (e.g., a wiring layer) in a later step can be improved. Therefore, disconnection or the like caused by a step can be prevented.

Figure 2C:
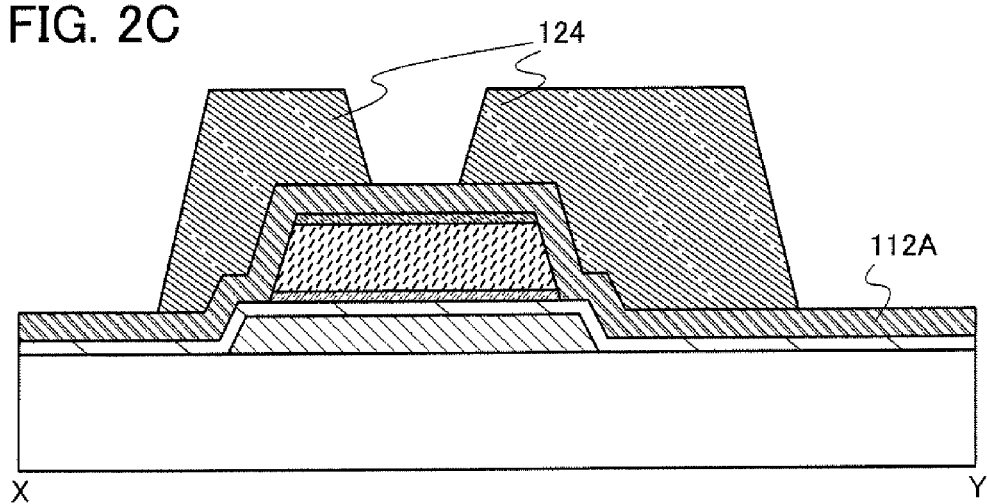

Next, a conductive film 112A is formed over the impurity semiconductor layer 110B and the gate insulating layer 104 (see FIG. 2C). The conductive film 112A is processed in a later step to form the source and drain electrode layers 112. There is no particular limitation on the conductive film 112A as long as the conductive film 112A is formed of a conductive material. As the conductive material, for example, a metal material such as Mo, Ti, Cr, Ta, W, Al, Cu, Nd, or Sc, or an alloy material containing the metal material as its main component can be used. Alternatively, crystalline silicon to which an impurity element imparting one conductivity type is added may be used. In addition, the conductive film 112A may be formed as a single layer or a stacked layer. For example, a two-layer structure in which a Ti layer or a Mo layer is stacked over an Al layer or a Cu layer, or a three-layer structure in which an Al layer or a Cu layer is interposed between Ti layers or Mo layers is preferably used. Alternatively, a Ti nitride may be used instead of the Ti layer.

The conductive film 112A is formed by a sputtering method, a vacuum evaporation method, or the like. Alternatively, the conductive film 112A may be formed by discharging a conductive nanopaste of Ag, Au, Cu, or the like by a screen printing method, an inkjet method, or the like and baking it.

Next, a resist mask 124 is formed over the conductive film 112A (see FIG. 2C). In a manner similar to that of the resist mask 120, the resist mask 124 is formed by photolithography or an inkjet method.

Figure 3A:
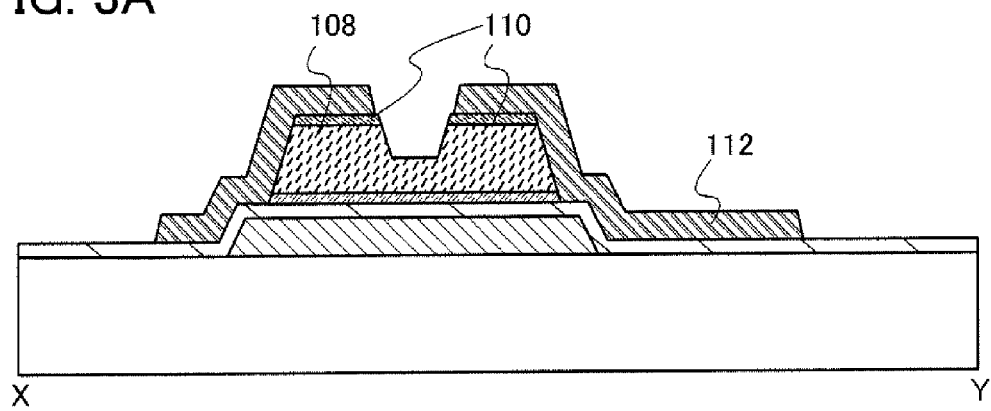
FIGS. 3A to 3C are views illustrating the example of the manufacturing method of the TFT.

Next, the conductive film 112A is processed by etching using the resist mask 124 to form the source and drain electrode layers 112 (see FIG. 3A). This etching is preferably wet etching. By wet etching, portions of the conductive film 112A, which are not covered with the resist mask 124, (that is, portions of the conductive film 112A which do not overlap with the resist mask 124) are isotropically etched. The source and drain electrode layers 112 form not only a source electrode and a drain electrode of a TFT but also a signal line.

Next, the impurity semiconductor layer 110B and the second semiconductor layer 108B are etched with the resist mask 124 to form the source and drain regions 110 and a back channel portion (see FIG. 3A). The second semiconductor layer 108B is etched with part thereof left to form the second semiconductor layer 108 including the back channel portion.

Here, dry etching using a gas including oxygen may be performed as the etching. With the use of the gas containing oxygen, the impurity semiconductor layer 110B and the second semiconductor layer 108B can be etched while the resist mask is made to recede, and accordingly the sides of the source and drain regions 110 and the second semiconductor layer 108 can be formed to have a tapered shape. As the etching gas, for example, an etching gas in which an $O_2$ gas is mixed into a $CF_4$ gas or an etching gas in which an $O_2$ gas is mixed into a chlorine gas may be used. When the sides of the source and drain regions 110 and the second semiconductor layer 108 have a tapered shape, electric field concentration can be prevented and off current can be reduced. As an example, a flow rate ratio of the $CF_4$ gas to the $O_2$ gas is set to be 45:55 (sccm). In addition, plasma discharge is performed under the following conditions: the pressure in the chamber is 2.5 Pa; the temperature of the inner wall of the chamber is 70° C.; the RF power source frequency is 13.56 MHz; the electric power is 500 W; and a coiled electrode is used. At this time, the etching can be performed in such a manner that an RF power source frequency of 13.56 MHz and electric power of 200 W are applied to the substrate side and substantially negative bias power is applied to generate self-bias voltage.

The second semiconductor layer 108 has a depression portion (the back channel portion) which is formed by etching. The second semiconductor layer 108 is preferably formed to a thickness such that at least part of the second semiconductor layer 108, which overlaps with the depression portion, remains after the etching. In other words, it is preferable that the first semiconductor layer 106 be not exposed in the back channel portion. The thickness of the second semiconductor layer 108 in a portion overlapping with the source and drain regions 110 is about 80 nm or more and 500 nm or less, preferably 150 nm or more and 400 nm or less, more preferably 200 nm or more and 300 nm or less. By forming the second semiconductor layer 108 with a sufficient thickness as described above, mixture of an impurity element or the like into the first semiconductor layer 106 can be prevented. In this manner, the second semiconductor layer 108 also serves as a protection layer of the first semiconductor layer 106.

Next, the resist mask 124 is removed (see FIG. 3A).

Note that a residual by-product generated in the etching step, a residue of the resist mask, substances which may be contamination sources in an apparatus which is used for removal of the resist mask, and a component of a resist-remover are attached or deposited on the second semiconductor layer 108 between the source and drain regions (that is, the back channel portion), which contributes to an increase in off current. Thus, for the purpose of removing them, dry etching may be performed under conditions which causes less damage, preferably without bias. Alternatively, plasma treatment or cleaning may be performed on the back channel portion. Further alternatively, these steps may be combined.

By the above steps, a TFT can be manufactured.

A change in drain current was measured ten times by changing the gate voltage of the thus manufactured TFT from −20 V to +20 V with the drain voltage of the TFT fixed. The result of measurement is shown in FIGS. 8A and 8B.

Note that here, "drain voltage" ("drain voltage") refers to a potential difference between the source electrode and the drain electrode when the potential of the source electrode is used as a reference potential.

Figure 8A:
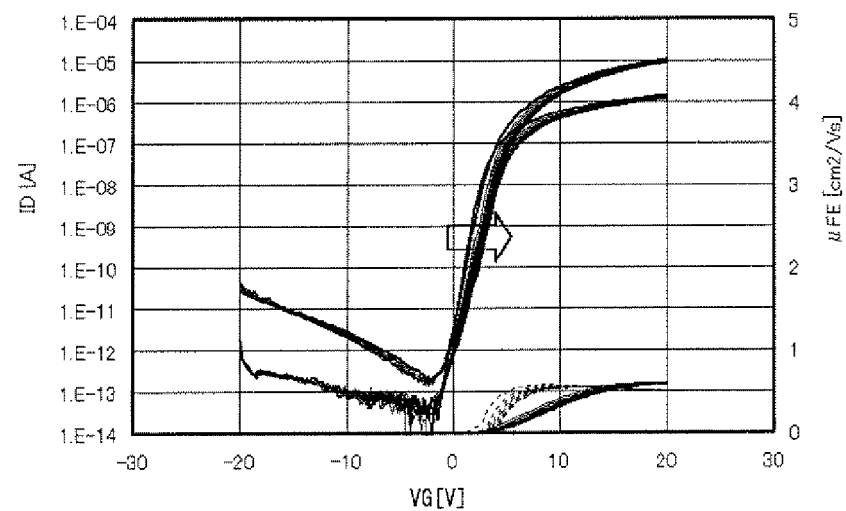
FIGS. 8A and 8B are graphs showing electrical characteristics of TFTs.

FIG. 8A shows the result of measurement of the drain current with respect to the gate voltage of a TFT which is manufactured in such a manner that the first semiconductor film 106A, the portions of the second semiconductor film 108A, which overlap with the source and drain regions 110, and the impurity semiconductor film 110A are formed to a thickness of 20 nm, 80 nm, and 50 nm, respectively without exposing the surface of the gate insulating layer 104 to an air atmosphere and without performing plasma treatment on the surface of the gate insulating layer 104, and after that processing is performed.

Figure 8B:
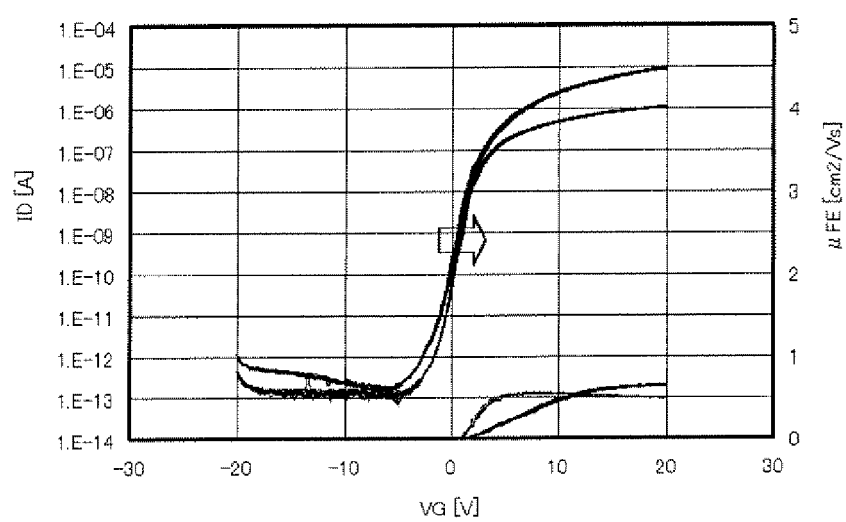

FIG. 8B shows the result of measurement of the drain current with respect to the gate voltage of the TFT which is manufactured in such a manner that after the surface of the gate insulating layer 104 is subjected to the exposure to an air atmosphere and plasma treatment, the first semiconductor film 106A (a microcrystalline semiconductor film), the second semiconductor film 108A, and the impurity semiconductor film 110A are formed to a thickness of 5 nm, 155 nm, and 50 nm, respectively, and after that processing is performed.

When FIG. 8A and FIG. 8B are compared, the voltage is shifted to the positive side by 1.41 V from the first measurement to the tenth measurement in FIG. 8A, whereas the voltage is shifted by only 0.40 V in FIG. 8B. Accordingly, it is found that the shift of the voltage is small in FIG. 8B and deterioration at initial operation of the TFT is suppressed ($V_{th}$ is shifted to the positive-polarity side when a gate voltage of a negative polarity is applied).

Here, as for the TFT the result of which illustrated in FIG. 8A was obtained, a cause of the deterioration at the initial operation is examined below. Here, the TFT the result of which shown in FIG. 8A was obtained is represented as Transistor A, and the TFT the result of which shown in FIG. 8B was obtained is represented as Transistor B.

A big difference between Transistor A and Transistor B is that Transistor B is formed in such a manner that the gate insulating layer 104 was subjected to the exposure to an air atmosphere and the plasma treatment after the gate insulating layer 104 is formed and before the first semiconductor film 106A serving as the first semiconductor layer 106 is formed. The reason for the above is probably as follows: nitrogen existing on the surface of the gate insulating layer 104 is reduced and the concentration of nitrogen contained in the first semiconductor layer 106 is reduced by the exposure to an air atmosphere and the plasma treatment. Note that, although plasma treatment is preferably performed here, it is not necessarily performed.

As for Transistor A, the threshold voltage tends to be largely shifted especially when a gate voltage of a negative polarity is applied. When a gate voltage of a negative polarity is applied, holes are induced in the first semiconductor layer in the vicinity of the gate insulating layer.

Figure 9A:
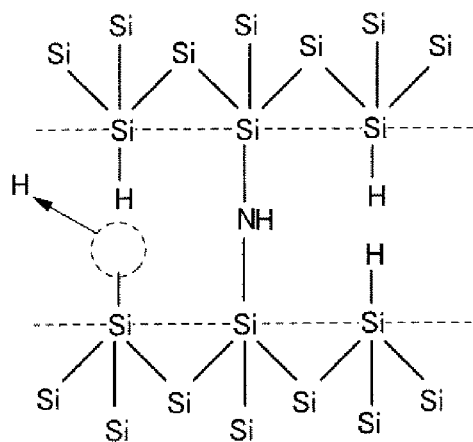
FIGS. 9A to 9D are views illustrating hydrogen transfer reactions.
Figure 9B:
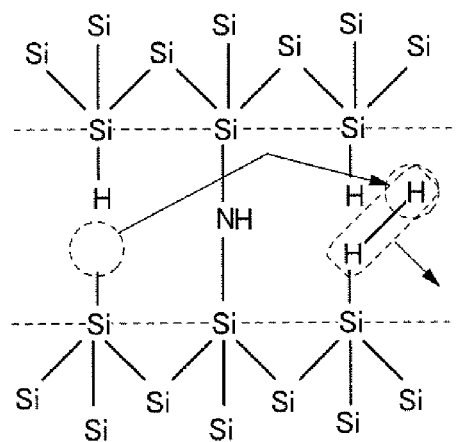
Figure 9C:
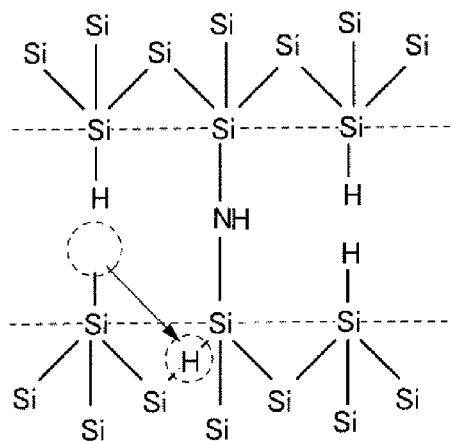
Figure 9D:
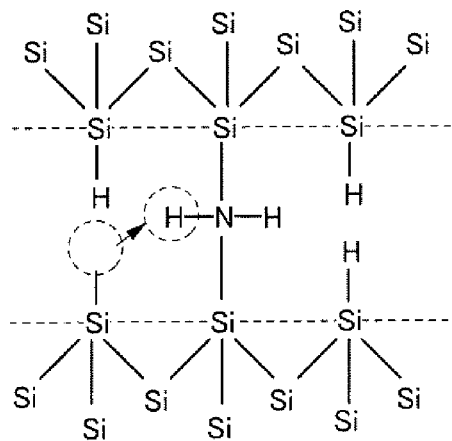

Here, the transfer reactions of H atoms at the time when an NH group exists in the vicinity of the interface between the gate insulating layer 104 and the first semiconductor layer 106 were measured using four reaction models illustrated in FIGS. 9A to 9D. FIG. 9A illustrates a reaction model in which an H atom detached from a Si atom is infinitely away from the Si atom. FIG. 9B illustrates a reaction model in which a detached H atom is bonded to another H atom and is detached as a hydrogen molecule ($H_2$). FIG. 9C illustrates a reaction model in which a detached H atom is bonded to Si atoms to be interposed therebetween. FIG. 9D illustrates a reaction model in which a detached H atom is bonded to an N atom to form an $NH_2$ group. The measurement results are shown in Table 1 below.

TABLE 1

|  | (A) | (B) | (C) | (D) |
| --- | --- | --- | --- | --- |
| WITHOUT CARRIER | 3.71 eV | 3.50 eV | 2.44 eV | 1.88 eV |
| WITH POSITIVE HOLE | 3.10 eV | 2.10 eV | 0.65 eV | −0.09 eV |
| WITH ELECTRON | 1.66 eV | 0.67 eV | 0.61 eV | 0.51 eV |

In the reactions whose models are illustrated in FIGS. 9A to 9C, the N atom is not involved in the detachment of the H atom (the N atoms are negligible), whereas in the reaction whose model is shown in FIG. 9D, the N atom is involved in the detachment of the H atom. Thus, any of the reactions illustrated in FIGS. 9A to 9C could occur when an NH group does not exist in a silicon layer. In addition, the reaction illustrated in FIG. 9D could occur when an NH group exists in a silicon layer.

According to FIG. 9D, it can be said that when holes exist, the reaction illustrated in FIG. 9D is an exothermal reaction and the reaction easily occurs. Accordingly, the detachment of an H atom is likely to occur when an N atom exists. Thus, a dangling bond easily occurs, holes are induced by application of a negative gate voltage to generate traps of electrons, and threshold voltage is shifted toward the positive-polarity side due to the traps. Thus, the threshold voltage is easily shifted toward the positive side in the case where an N atom exists and deterioration caused at initial operation is probably due to the existence of the N atom.

Note that here, "gate voltage" ("gate voltage") refers to a potential difference between a source electrode and a gate electrode when the potential of the source electrode is used as a reference potential.

As described above, the silicon nitride film is exposed to an air atmosphere and the plasma treatment is performed on this silicon nitride film, whereby the concentration of nitrogen in the semiconductor layer in the vicinity of the interface between the semiconductor layer and the gate insulating layer can be reduced, the shift of the threshold voltage can be reduced, and the deterioration caused at the initial operation can be prevented.

Note that the TFT described above can be applied to a pixel TFT (a pixel transistor) of a display device. Hereinafter, subsequent steps are described.

Figure 3B:
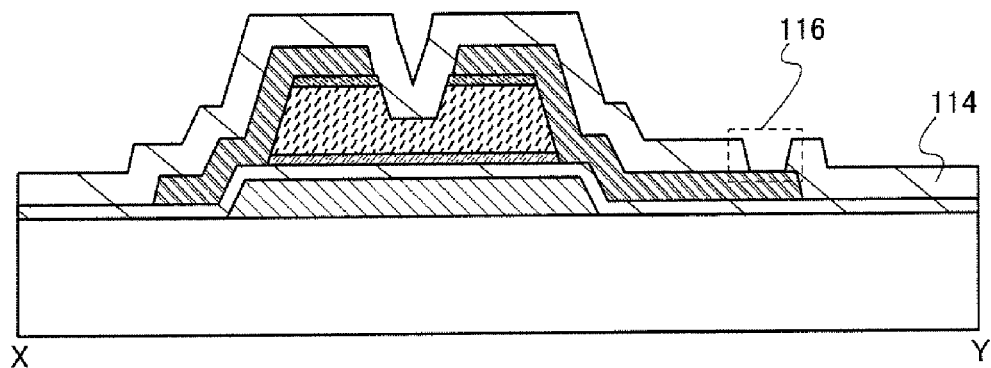

First, an insulating layer 114 is formed so as to cover the TFT manufactured as described above (see FIG. 3B). The insulating layer 114 can be formed in a manner similar to that of the gate insulating layer 104 and is preferably formed using silicon nitride. In particular, the insulating layer 114 is preferably a dense silicon nitride layer in order that entry of impurities which may be contamination sources, such as organic substances, metal substances, or water vapor floating in the air, into the TFT can be prevented. When a silicon nitride film is formed by a high frequency (specifically, 13.56 MHz or higher) plasma CVD method and an opening 116 is formed in the silicon nitride film, a dense silicon nitride layer can be formed.

Figure 3C:
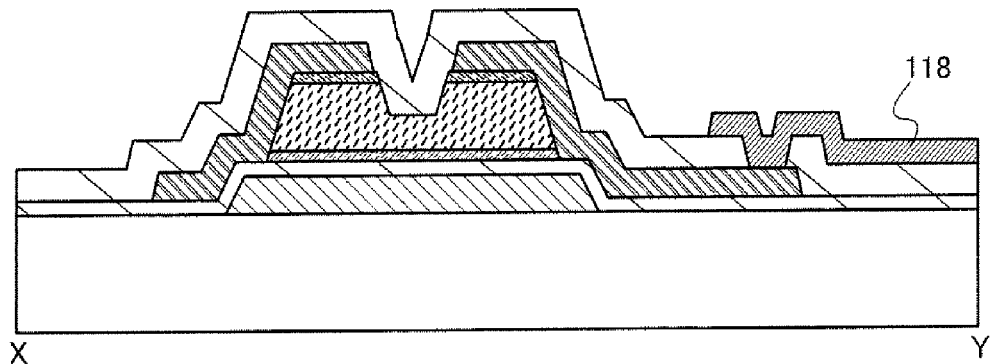

Note that the insulating layer 114 has the opening 116 which reaches the source or drain electrode layer 112, and one of the source and drain electrode layers 112 is connected to a pixel electrode layer 118 through the opening 116 provided in the insulating layer 114 (see FIG. 3C).

The pixel electrode layer 118 can be formed using a conductive composition including a conductive high molecule (also referred to as a conductive polymer) having a light-transmitting property. The pixel electrode layer 118 formed using a conductive composition preferably has a sheet resistance of 10000 Ω/square or less and a light transmittance of 70% or more at a wavelength of 550 nm. Note that the resistivity of the conductive high molecule included in the conductive composition is preferably 0.1 Ω·cm or less.

As the conductive high-molecular compound, a so-called "π electron conjugated conductive high-molecular compound" can be used. For example, polyaniline or a derivative thereof, polypyrrole or a derivative thereof, polythiophene or a derivative thereof, and a copolymer of two or more kinds of those materials can be given.

The pixel electrode layer 118 can be formed using, for example, indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like.

The pixel electrode layer 118 may be formed in a manner similar to that of the source and drain electrode layers 112 or the like, that is, a film is entirely formed and the film is processed by etching using a resist mask or the like.

Although not illustrated, an insulating layer formed using an organic resin by a spin coating method or the like may be provided between the insulating layer 114 and the pixel electrode layer 118.

Note that in the above description, the gate electrode and the scan line are formed in the same process and the source and drain electrodes and the signal line are formed in the same process. However, the present invention is not limited thereto. An electrode and a wiring connected to the electrode may be formed in different steps.

As described above, an array substrate of a display device which is an embodiment of the present invention can be manufactured.

Note that, although the bottom gate TFT is described in this embodiment, the present invention is not limited thereto. There is no particular limitation on the mode of the TFT as long as the TFT is manufactured by exposing its portion which serves as the interface between the gate insulating layer and the semiconductor layer to an air atmosphere. For example, the TFT may be a dual-gate TFT in which a semiconductor layer is interposed between gate electrodes with insulating films interposed therebetween or may be a top gate TFT.

(Embodiment 2)

In Embodiment 2, a manufacturing method of a TFT which is an embodiment of the present invention and is different from the one described in Embodiment 1 will be described. Specifically, a TFT is manufactured using a smaller number of photomasks by using a resist mask having regions with different thicknesses.

First, as in Embodiment 1, a gate insulating layer 204 is formed so as to cover a gate electrode layer 202 provided over a substrate 200, and a first semiconductor film 206A, a second semiconductor film 208A, and an impurity semiconductor film 210A are formed over the gate insulating layer 204.

Further, a conductive film 212A is formed over the impurity semiconductor film 210A.

Figure 10A:
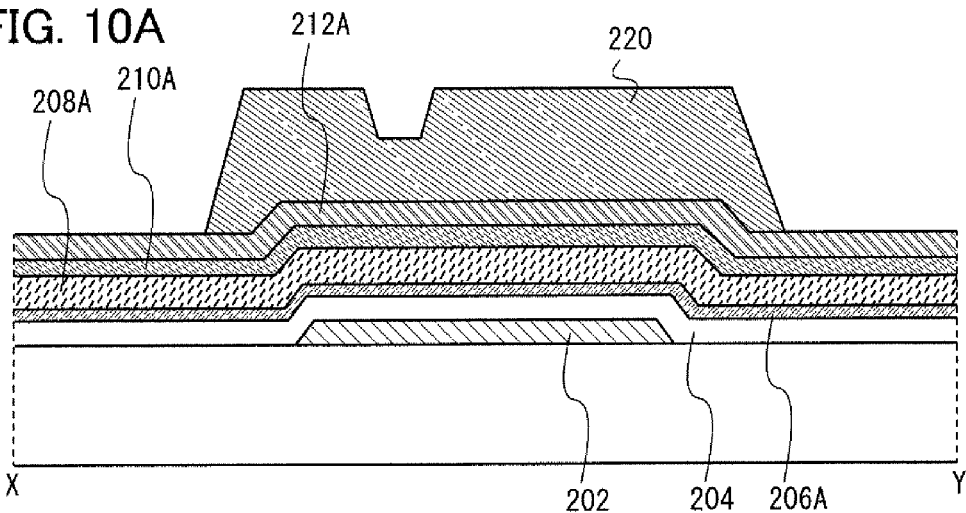
FIGS. 10A to 10C are views illustrating an example of a manufacturing method of the TFT.

Next, a resist mask 220 is formed over the conductive film 212A (see FIG. 10A). The resist mask 220 in this embodiment can also be referred to as a resist mask including a plurality of regions (here, two regions) with different thicknesses. A region of the first resist mask 220, which has a larger thickness, is referred to as a projecting portion of the first resist mask 220. A region of the resist mask 220, which has a smaller thickness, is referred to as a depressed portion of the resist mask 220.

In the resist mask 220, the projection portion is formed in a region where source and drain electrode layers 212 are to be formed and the depressed portion is formed in a region where a second semiconductor layer 208 is to be exposed.

The first resist mask 220 can be formed using a multi-tone mask. Here, multi-tone masks are described below with reference to FIGS. 12A-1, 12A-2, 12B-1, and 12B-2.

The multi-tone mask is a mask capable of light exposure with multi-level light intensity. For example, light exposure is performed with three levels of light intensity to provide an exposed region, a half-exposed region, and an unexposed region. The use of the multi-tone mask makes it possible to form a resist mask with plural thicknesses (e.g., two levels of thicknesses) in a one-time light exposure and development process. Accordingly, the use of the multi-tone mask makes it possible to reduce the number of photomasks to be used.

Figures 1, 12A:
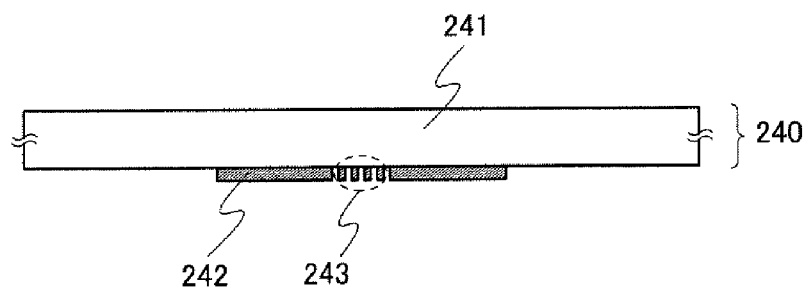
FIGS. 12A-1, 12A-2, 12B-1, and 12B-2 are views illustrating examples of multi-tone masks.
Figures 2, 12A:
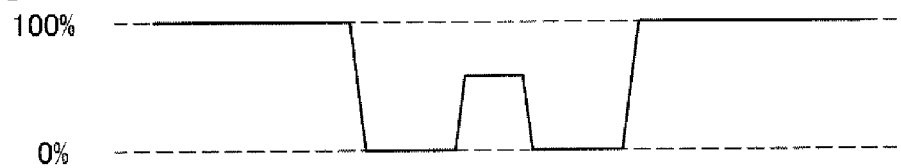
Figures 1, 12B:
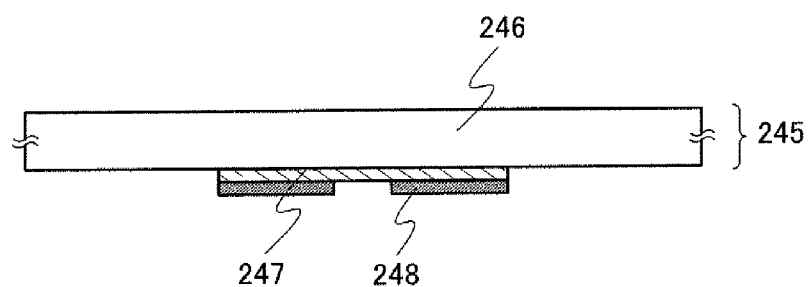
Figures 2, 12B:
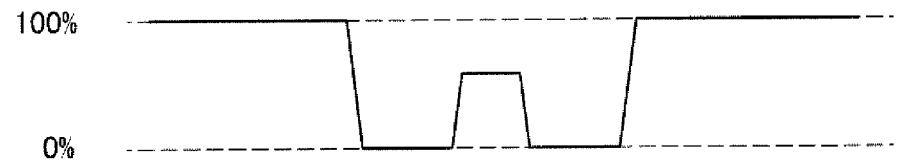

FIGS. 12A-1 and 12B-1 are cross-sectional views of typical multi-tone masks. FIG. 12A-1 illustrates a gray-tone mask 240 and FIG. 12B-1 illustrates a half-tone mask 245.

The gray-tone mask 240 illustrated in FIG. 12A-1 includes a light-shielding portion 242 and a diffraction grating portion 243 which are formed using a light-shielding material and are on a substrate 241 having a light-transmitting property.

The transmittance of light is controlled by slits, dots, mesh, or the like of the diffraction grating portion 243, which are provided at an interval less than or equal to the resolution limit of light used for light exposure. Note that the slits, dots, or mesh provided at the diffraction grating portion 243 may be provided periodically or non-periodically.

As a substrate 241 having a light-transmitting property, quartz or the like can be used. As the light-shielding material used for forming the light-shielding portion 242 and the diffraction grating portion 243, a metal material is given and Cr, Cr oxide, or the like is preferably used.

In the case where the gray-tone mask 240 is irradiated with light for light exposure, as illustrated in FIGS. 12A-1 and 12A-2, the transmittance in the region overlapping with the light-shielding portion 242 is 0%, and the transmittance in the region where neither the light-shielding portion 242 nor the diffraction grating portion 243 is provided is 100%. Note that the transmittance at the diffraction grating portion 243 is approximately 10% to 70%, which can be adjusted by the interval of slits, dots, or mesh of the diffraction grating, or the like.

The half-tone mask 245 illustrated in FIG. 12B-1 includes a semi-light-transmitting portion 247 formed using a semi-light-transmitting material and a light-shielding portion 248 formed using a light-shielding material which are on a substrate 246 having a light-transmitting property.

The semi-light-transmitting portion 247 can be formed using MoSiN, MoSi, MoSiO, MoSiON, CrSi, or the like. The light-shielding portion 248 may be formed using a metal material which is similar to that of the light-shielding portion 242 of the gray-tone mask, and Cr, Cr oxide, or the like is preferably used.

In the case where the half-tone mask 245 is irradiated with light for light exposure, as illustrated in FIGS. 12B-1 and 12B-2, the transmittance in the region overlapping with the light-shielding portion 248 is 0%, and the transmittance in the region where neither the light-shielding portion 248 nor the semi-light-transmitting portion 247 is provided is 100%. Note that the transmittance at the semi-light-transmitting portion 247 is approximately 10% to 70%, which can be adjusted by control of the kind, the thickness, or the like of the material to be used.

By light exposure using the multi-tone mask and development, the resist mask 220 which has regions with different thicknesses can be formed. Note that without limitation thereto, the resist mask 220 may be formed without a multi-tone mask. As an example of a method of forming the resist mask 220 without a multi-tone mask, a method in which a depressed portion is irradiated with laser light is given.

Figure 10B:
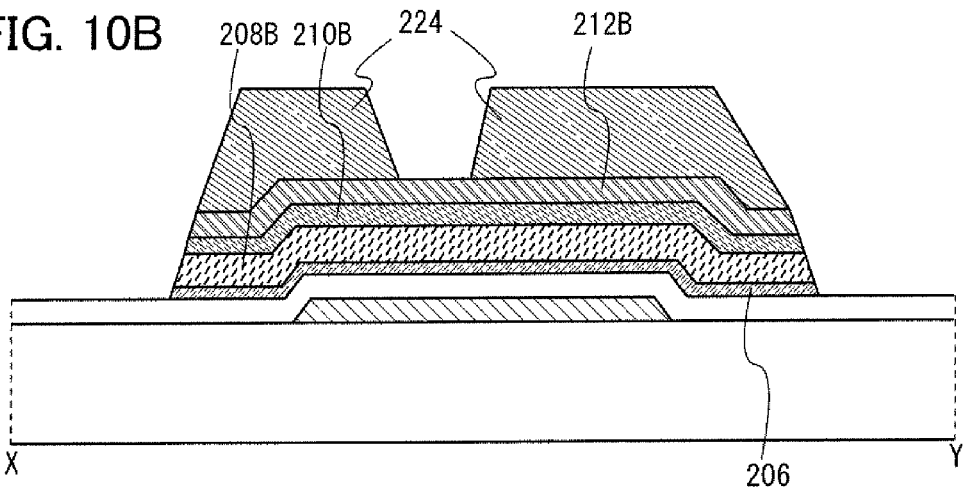

Next, patterning is performed using the resist mask 220 to form a first semiconductor layer 206, a second semiconductor layer 208B, an impurity semiconductor layer 210B, and a conductive layer 212B (see FIG. 10B).

Next, the resist mask 220 is made to recede (is reduced) to form a resist mask 224. After that, etching is performed using the resist mask 224 (see FIG. 1013). In order to make the resist mask 220 recede (reduce the resist mask 220), ashing using O₂ plasma or the like may be performed. The etching conditions or the like are similar to those in Embodiment 1.

Figure 10C:
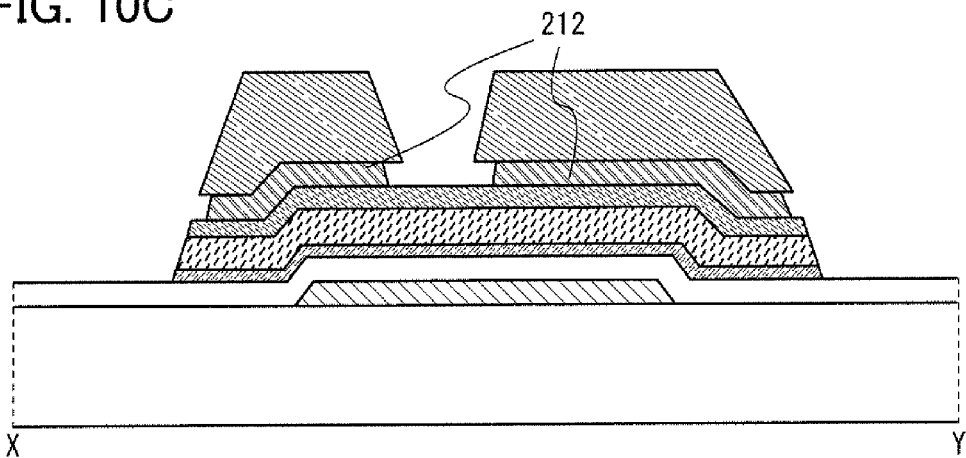
Figure 11A:
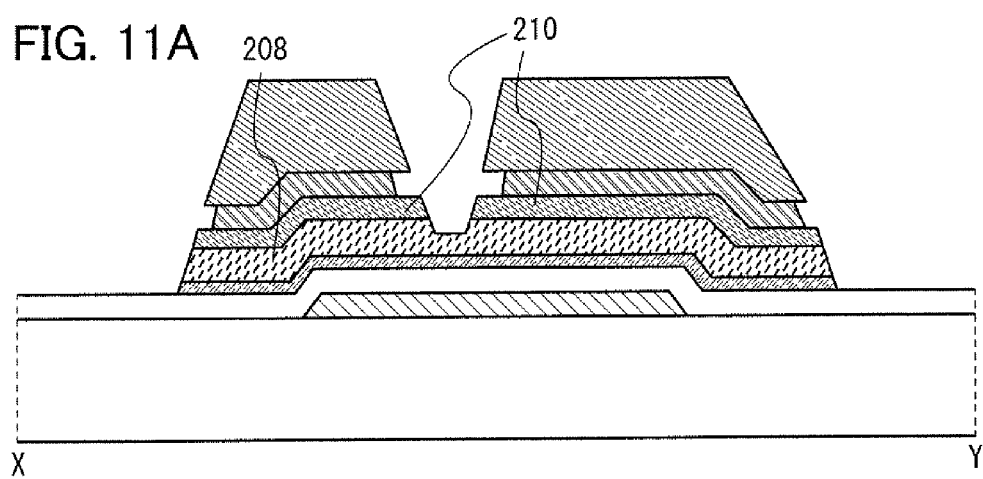
FIGS. 11A and 11B are views illustrating an example of a manufacturing method of a TFT.
Figure 11B:
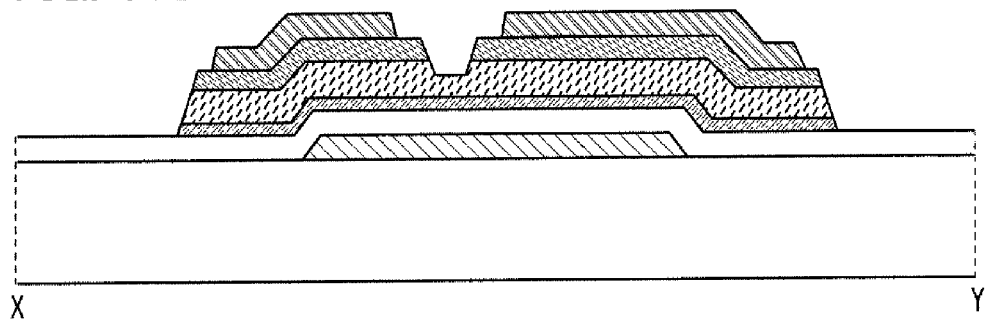

Next, the conductive layer 21213 is etched using the resist mask 224 to form the source and drain electrode layers 212 (see FIG. 10C). After that, the impurity semiconductor layer 21013 and the second semiconductor layer 208B are partly etched to form a source and drain regions 210 and a second semiconductor layer 208 having a back channel portion (see FIG. 11A). After that, the resist mask 224 is removed (see FIG. 11B).

As described in this embodiment, a TFT can be manufactured using the multi-tone mask. The use of the multi-tone mask makes it possible to further reduce the number of photomasks to be used.

Note that as in Embodiment 1, an insulating layer may be formed so as to cover the thus manufactured TFT and a pixel electrode layer which is connected to a source or drain electrode layer 212 may be formed.

Note that, although the bottom gate TFT is described also in this embodiment, the present invention is not limited thereto. For example, the TFT may be a dual-gate TFT in which a semiconductor layer is interposed between gate electrodes with insulating films interposed therebetween or may be a top gate TFT.

(Embodiment 3)

In Embodiment 3, one mode of a display panel or a light-emitting panel will be described with reference to drawings.

In a display device or a light-emitting device of this embodiment, a signal line driver circuit and a scan line driver circuit may be formed over a different substrate (e.g., a semiconductor substrate or an SOI substrate) and then connected to a pixel portion or may be formed over the same substrate as a pixel circuit.

Note that a connection method of a substrate which is separately formed is not limited to a certain method, and a known method such as a COG method, a wire bonding method, or a TAB method can be used. Note that a connection position is not particularly limited to a certain position as long as electrical connection is possible. Note also that a controller, a CPU, a memory, and/or the like may be formed separately and connected to the pixel circuit.

Figure 13:
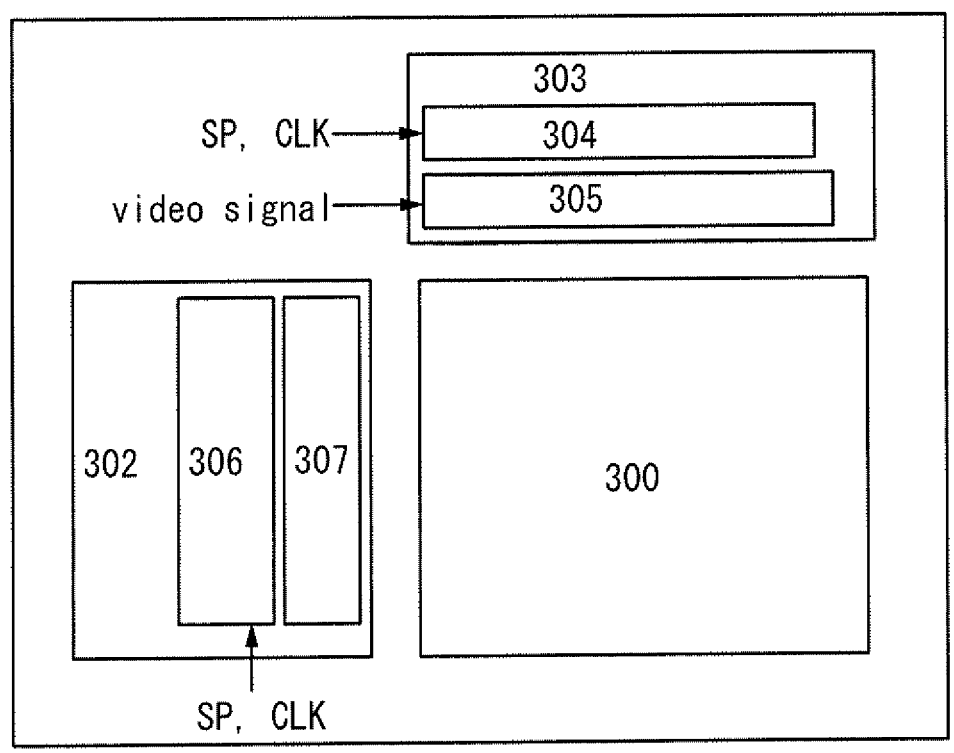
FIG. 13 is a view illustrating an example of a display device.

FIG. 13 is a block diagram of a display device. The display device illustrated in FIG. 13 includes a pixel portion 300 including a plurality of pixels each provided with a display element, a scan line driver circuit 302 which selects each pixel, and a signal line driver circuit 303 which controls input of a video signal to a selected pixel.

Note that the display device is not limited to the mode illustrated in FIG. 13. In other words, the signal line driver circuit is not limited to a mode including only a shift register and an analog switch. In addition to the shift register and the analog switch, another circuit such as a buffer, a level shifter, or a source follower may be included. Note that the shift register and the analog switch are also not necessarily provided. For example, another circuit such as a decoder circuit by which a signal line can be selected may be used instead of the shift register, or a latch or the like may be used instead of the analog switch.

The signal line driver circuit 303 illustrated in FIG. 13 includes a shift register 304 and an analog switch 305. A clock signal (CLK) and a start pulse signal (SP) are input to the shift register 304. When the clock signal (CLK) and the start pulse signal (SP) are input, a timing signal is generated in the shift register 304 and is input to the analog switch 305.

A video signal is supplied to the analog switch 305. The analog switch 305 samples the video signal in accordance with the input timing signal and supplies the sampled video signal to a signal line of the next stage.

The scan line driver circuit 302 illustrated in FIG. 13 includes a shift register 306 and a buffer 307. The scan line driver circuit 302 may further include a level shifter in some cases. In the scan line driver circuit 302, when a clock signal (CLK) and a start pulse signal (SP) are input to the shift register 306, a selection signal is produced. The generated selection signal is buffer amplified in the buffer 307, and then supplied to a corresponding scanning line. Gates of TFTs in all pixels of one line are connected to the scan line. Further, because the TFTs in the pixels of one line should be turned on at the same time in the operation, a buffer through which large current can flow is used as the buffer 307.

In a full-color display device, when video signals corresponding to R (red), G (green), and B (blue) are sequentially sampled and supplied to a corresponding signal line, the number of terminals for connecting the shift register 304 and the analog switch 305 corresponds to approximately ⅓ of the number of terminals for connecting the analog switch 305 and the signal line of the pixel portion 300. Accordingly, in comparison to the case where the analog switch 308 and the pixel portion 300 are formed over different substrates, the number of terminals used for connecting substrates which are separately formed can be suppressed when the analog switch 308 and the pixel portion 300 are formed over one substrate. Thus, occurrence probability of bad connection can be suppressed and yield can be improved.

Note that the scan line driver circuit 302 illustrated in FIG. 13 includes, but without limitation, the shift register 306 and the buffer 307. The scan line driver circuit 302 may be formed using only the shift register 306 without providing the buffer 307.

Note that the structures of the signal line driver circuit and the scan line driver circuit are not limited to the structure illustrated in FIG. 13, which are merely one mode of the display device.

Figure 14A:
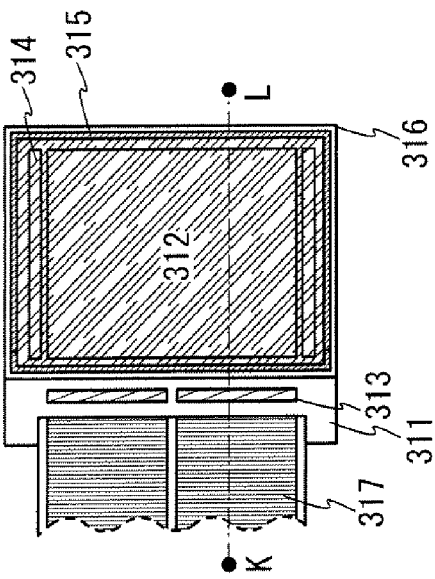
FIGS. 14A and 14B are views illustrating an example of a liquid crystal display device.
Figure 14B:
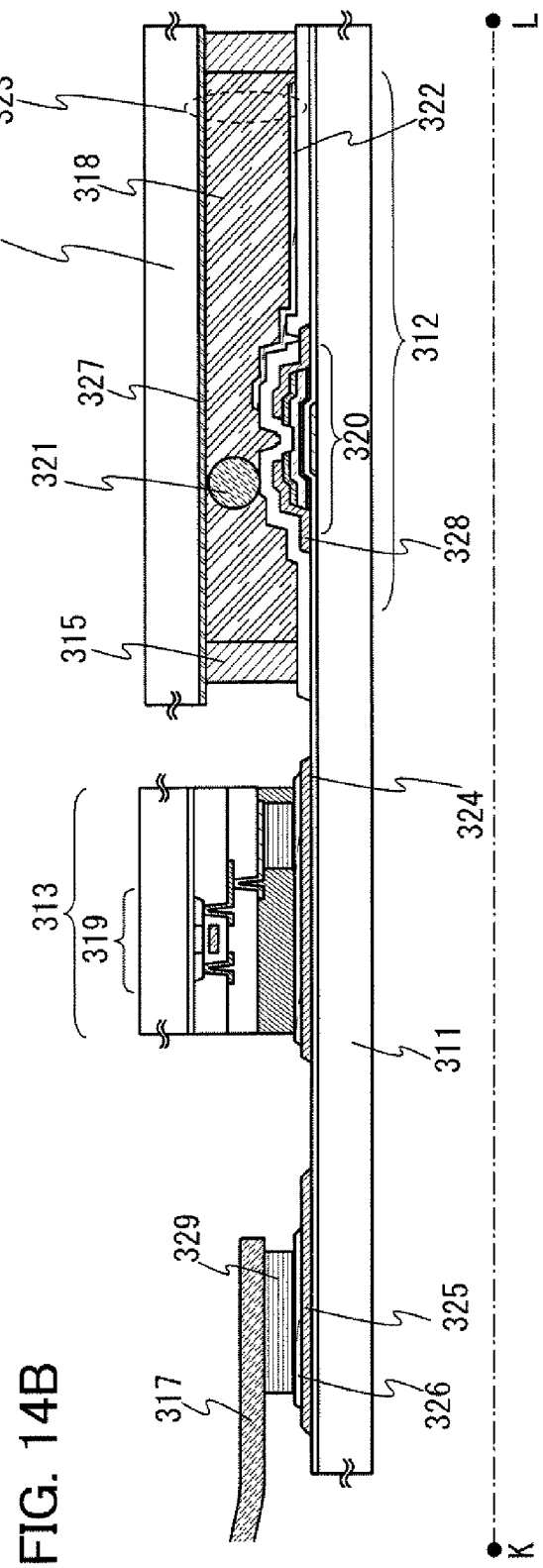
Figure 15A:
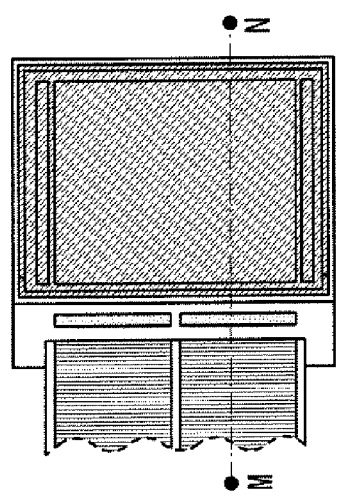
FIGS. 15A and 15B are views illustrating an example of a light-emitting device.
Figure 15B:
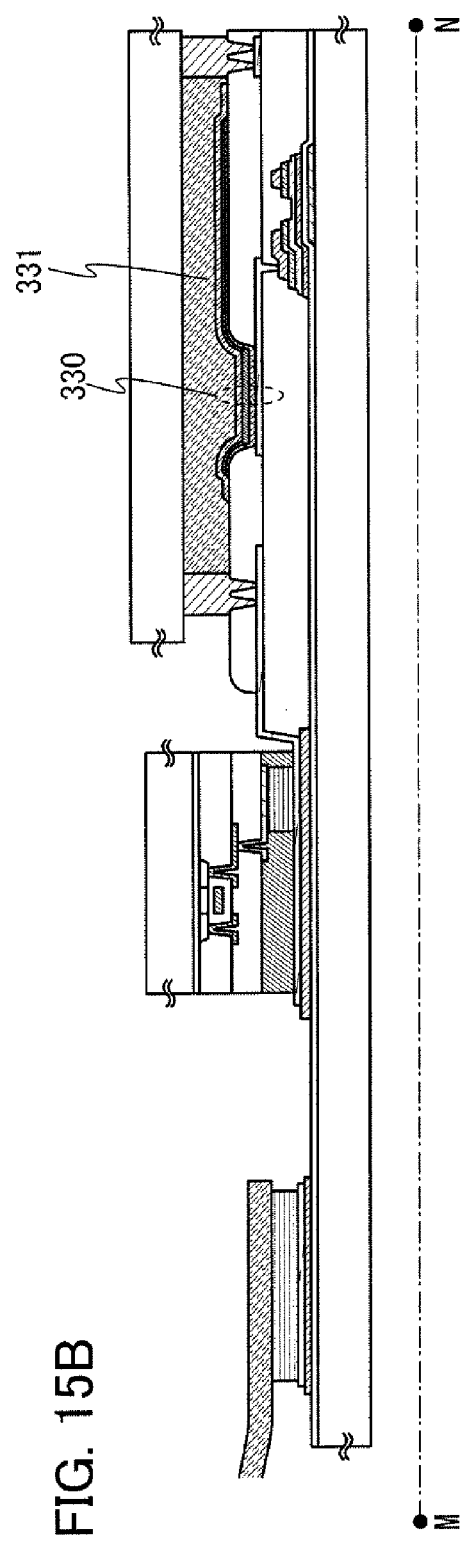

Next, top views and cross-sectional views of a liquid crystal display panel and a light-emitting panel which correspond to one mode of the display device are described with reference to FIGS. 14A and 14B and FIGS. 15A and 15B. FIG. 14A is a top view of a display panel in which a TFT 320 including a crystalline semiconductor and a liquid crystal element 323 which are formed over a first substrate 311 are sealed with a sealant 315 between the first substrate 311 and a second substrate 316. FIG. 14B is a cross-sectional view taken along a line K-L in FIG. 14A. FIGS. 15A and 1513 illustrate a case of a light-emitting device. Note that in FIGS. 15A and 15B, only portions which are different from FIGS. 14A and 1413 are denoted with reference numerals.

The sealant 315 is provided so as to surround a pixel portion 312 and a scan line driver circuit 314 which are provided over the first substrate 311. The second substrate 316 is provided over the pixel portion 312 and the scan line driver circuit 314. Thus, the pixel portion 312 and the scan line driver circuit 314, together with a liquid crystal layer 318 or a filler 331, are sealed with the first substrate 311, the sealant 315, and the second substrate 316. A signal line driver circuit 313 is mounted on a region outside a region surrounded by the sealant 315 over the first substrate 311. Note that the signal line driver circuit 313 is provided using a TFT including a crystalline semiconductor, which is formed over a separately prepared substrate. Note that, although an example in which the signal line driver circuit 313 using a TFT including a crystalline semiconductor is attached to the first substrate 311 is described in this embodiment, a signal line driver circuit is preferably formed with a TFT using a single crystal semiconductor and attached to the first substrate 311. FIG. 1413 illustrates a TFT 319 formed using a crystalline semiconductor, which is included in the signal line driver circuit 313.

The pixel portion 312 provided over the first substrate 311 includes a plurality of TFTs, and in FIG. 14B, a TFT 320 included in the pixel portion 312 is illustrated as an example. In addition, the signal line driver circuit 314 also includes a plurality of TFTs, and in FIG. 14B, a TFT 319 included in the signal line driver circuit 314 is illustrated as an example. Note that in the light-emitting device in this embodiment, the TFT 320 may be a driving TFT, a current control TFT, or an erasing TFT. The TFT 320 corresponds to the TFT described in Embodiment 1.

In addition, the pixel electrode 322 included in the liquid crystal element 323 is electrically connected to the TFT 320 through a wiring 328. A counter electrode 327 of the liquid crystal element 323 is formed on the second substrate 316. A portion in which the pixel electrode 322, the counter electrode 327, and the liquid crystal layer 318 overlap one another corresponds to the liquid crystal element 323.

Note that a pixel electrode included in the light-emitting element 330 is electrically connected to a source electrode or a drain electrode of the TFT 320 through a wiring. Further, in this embodiment, a common electrode of the light-emitting element 330 and the pixel electrode having a light-transmitting property are electrically connected to each other. The structure of the light-emitting element 330 is not limited to the structure described in this embodiment. The structure of the light-emitting element 330 can be determined in accordance with a direction of light taken from the light-emitting element 330, polarity of the TFT 320, or the like.

Note that as a material of the first substrate 311 and the second substrate 316, glass, metal (e.g., stainless steel), ceramic, plastic, or the like can be used. As plastic, a fiberglass-reinforced plastics (FRP) plate, a polyvinyl fluoride (PVF) film, a polyester film, an acrylic resin film, or the like can be used. Alternatively, a sheet in which aluminum foil is interposed by PVF films or polyester films may also be used.

A spacer 321 is a bead spacer and is provided for controlling the distance (a cell gap) between the pixel electrode 322 and the counter electrode 327. Note that a spacer (a post spacer) which is obtained by selective etching of an insulating layer may also be used.

Note that a variety of signals (potentials) are supplied to the signal line driver circuit 313 which is formed separately, the pixel portion 312, and the scan line driver circuit 314 from a flexible printed circuit (FPC) 317 through the lead wiring 324 and the lead wiring 325.

In this embodiment, a connection terminal 326 is formed using the same conductive layer as the pixel electrode 322 included in the liquid crystal element 323. The lead wiring 324 and the lead wiring 325 are formed using the same conductive layer as the wiring 328.

The connecting terminal 326 is electrically connected to a terminal included in the FPC 317 through an anisotropic conductive layer 329.

Although not illustrated, the liquid crystal display device described in this embodiment includes alignment films and polarizing plates, and may also include a color filter, a light-shielding layer or the like.

In this embodiment, the connecting terminal 326 is formed of the same conductive layer as that of the pixel electrode included in the light-emitting element 330. In addition, the lead wiring 325 is formed of the same conductive layer as that of the wiring 328. However, the present invention is not limited thereto.

Note that a light-transmitting substrate is used as the second substrate located in the direction in which light is extracted from the light-emitting element 330. In that case, a substrate formed using a light-transmitting material, such as a glass plate, a plastic plate, a polyester film, or an acrylic film, is used. When light is extracted from the light-emitting element 330 in a direction of the first substrate, a light-transmitting substrate is used as the first substrate.

Note that as the filler 331, an ultraviolet curable resin, a thermosetting resin, or the like as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. Here, for example, an $N_2$ gas may be used.

Note that an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer.

(Embodiment 4)

The present invention disclosed in Embodiments 1 to 3 can be applied to a variety of electronic devices (including game machines). Examples of such an electronic device include a television set (also referred to as a television or a television receiver), a monitor of a computer, electronic paper, a camera such as a digital camera or a digital video camera, a digital photo frame, a mobile phone set (also referred to as a mobile phone or a mobile phone device), a portable game machine, a portable information terminal, an audio reproducing device, a large-sized game machine such as a pachinko machine, and the like.

The present invention disclosed in Embodiments 1 to 3 can be applied to, for example, an electronic paper. An electronic paper can be used for electronic devices of a variety of fields as long as they can display data. For example, an electronic paper can be used for electronic book devices (e-books), posters, advertisements in vehicles such as trains, display of data on a variety of cards such as credit cards, and so on. An example of such an electronic device is illustrated in FIG. 16A.

Figure 16A:
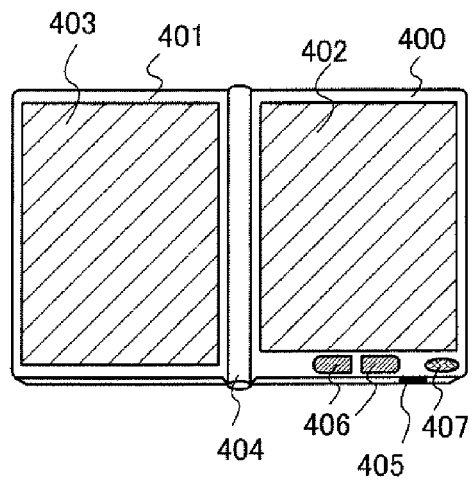
FIGS. 16A to 16D are diagrams illustrating examples of electronic devices.

FIG. 16A illustrates an example of the electronic book device. The electronic book device illustrated in FIG. 16A includes housings 400 and 401. The housings 400 and 401 are combined with each other with a hinge 404, so that the electronic book device can be opened and closed. With such a structure, the electronic book device can be handled like a paper book.

A display portion 402 is incorporated in the housing 400, and a display portion 403 is incorporated in the housing 401. The display portion 402 and the display portion 403 may be configured to display one image or different images. In the case where the display portion 402 and the display portion 403 display different images, for example, text can be displayed on a display portion on the right side (the display portion 402 in FIG. 16A) and graphics can be displayed on a display portion on the left side (the display portion 403 in FIG. 16A). The display device described in Embodiment 3 can be applied to the display portions 402 and 403.

FIG. 16A illustrates an example in which the housing 400 is provided with an operation portion and the like. For example, the housing 400 is provided with a power input terminal 405, an operation key 406, a speaker 407, and the like. The page can be turned with the operation key 406, for example. Note that a keyboard, a pointing device, or the like may also be provided on the surface of the housing, on which the display portion is provided. Note that an external connection terminal (an earphone terminal, a USB terminal, a terminal that can be connected to various cables such as an AC adapter and a USB cable, or the like), a recording medium insert portion, or the like may be provided on the back surface or the side surface of the housing. Furthermore, the electronic book device illustrated in FIG. 16A may have a function of an electronic dictionary.

The electronic book device illustrated in FIG. 16A may be configured to transmit and receive data wirelessly. By wireless communication, desired book data or the like can be purchased and downloaded from an electronic book server.

Figure 16B:
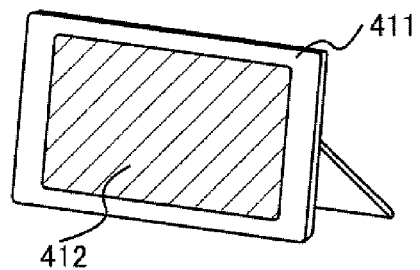

FIG. 16B illustrates an example of a digital photo frame. For example, in the digital photo frame illustrated in FIG. 16B, a display portion 412 is incorporated in a housing 411. Various images can be displayed on the display portion 412. For example, the display portion 412 can display data of an image shot by a digital camera or the like to function as a normal photo frame. The display device described in Embodiment 3 can be applied to the display portion 412.

Note that the digital photo frame illustrated in FIG. 16B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing data of an image shot by a digital camera is inserted in the recording medium insertion portion of the digital photo frame, whereby the image data can be downloaded and displayed on the display portion 412.

The digital photo frame illustrated in FIG. 16B may be configured to transmit and receive data wirelessly. The structure may be employed in which desired image data is transferred wirelessly to be displayed.

Figure 16C:
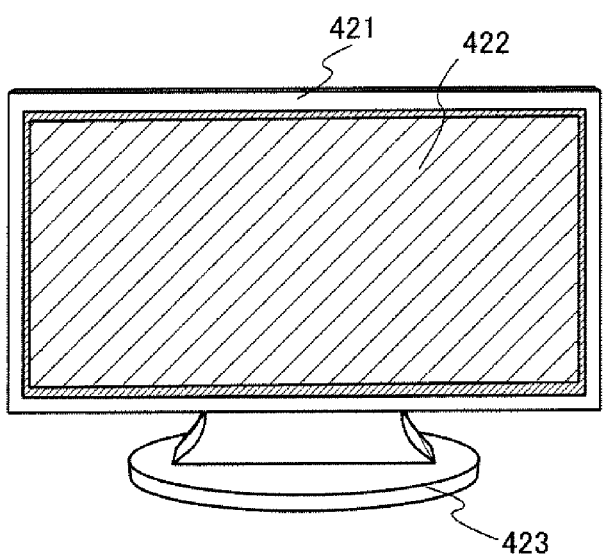

FIG. 16C illustrates an example of a television set. In the television set illustrated in FIG. 16C, a display portion 422 is incorporated in a housing 421. Images can be displayed on the display portion 422. Here, the housing 421 is supported by a stand 423. The display device described in Embodiment 3 can be applied to the display portion 422.

The television set illustrated in FIG. 16C can be operated with an operation switch of the housing 421 or a separate remote controller. Channels and volume can be controlled with an operation key of the remote controller so that an image displayed on the display portion 422 can be controlled. Note that the remote controller may be provided with a display portion for displaying data outputted from the remote controller.

Note that the television set illustrated in FIG. 16C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver, between receivers, or the like) data communication can be performed.

Figure 16D:
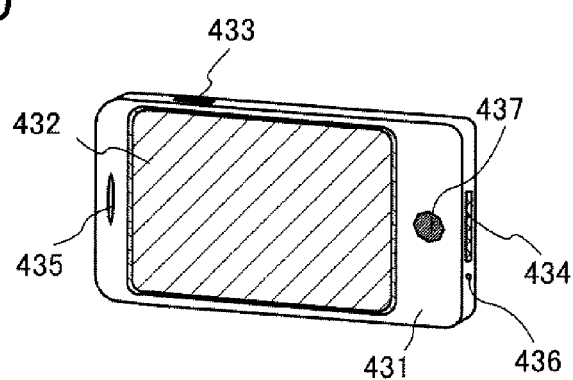

FIG. 16D illustrates an example of a cellular phone set. The cellular phone set illustrated in FIG. 16D is provided with a display portion 432 incorporated in a housing 431, operation buttons 433 and 437, an external connection port 434, a speaker 435, a microphone 436, and the like. The display device described in Embodiment 3 can be applied to the display portion 432.

The display portion 432 of the cellular phone set illustrated in FIG. 16D may be a touch panel. When the display portion 432 is touched with a finger or the like, contents displayed on the display portion 432 can be controlled. In this case, making calls, composing mails, and the like can be performed by touching the display portion 432 with a finger or the like.

There are mainly three screen modes of the display portion 432. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 432 so that text displayed on the screen can be input. In that case, it is preferable to display a keyboard or number buttons on a large area of the screen of the display portion 432.

When a detection device including a sensor for detecting inclination, such as a gyroscope or an acceleration sensor, is provided inside the cellular phone set illustrated in FIG. 16D, display data for the display portion 432 can be automatically switched by determining the orientation of the cellular phone set (whether the cellular phone set is placed horizontally or vertically for a landscape mode or a portrait mode).

The screen modes may be switched by touching the display portion 432 or operating the operation button 437 of the housing 431. Alternatively, the screen modes may be switched depending on the kind of the image displayed on the display portion 432. For example, when a signal of an image displayed on the display portion is the one of moving image data, the screen mode is changed to the display mode. When the signal is the one of text data, the screen mode is changed to the input mode.

Note that in the input mode, when input by touching the display portion 432 is not performed within a specified period while a signal detected by the optical sensor in the display portion 432 is detected, the screen mode may be controlled so as to be switched from the input mode to the display mode.

The display portion 432 can also function as an image sensor. For example, when an image of a palm print, a fingerprint, or the like is taken by the image sensor by touching the display portion 432 with a palm or a finger, personal authentication can be performed. Note that by using a backlight or a sensing light source emitting near-infrared light for the display portion, an image of a finger vein, a palm vein, or the like can be taken.

Figure 17A:
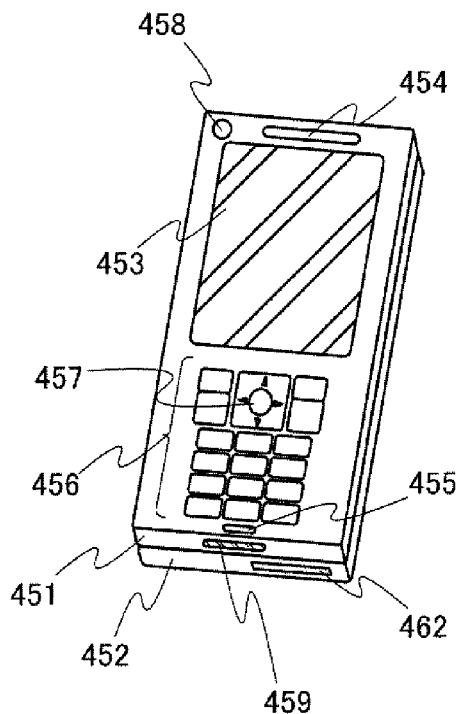
FIGS. 17A to 17C are diagrams illustrating an example of an electronic device.
Figure 17B:
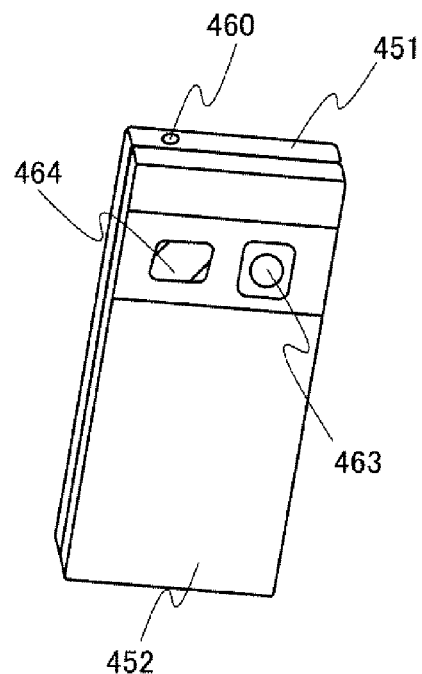
Figure 17C:
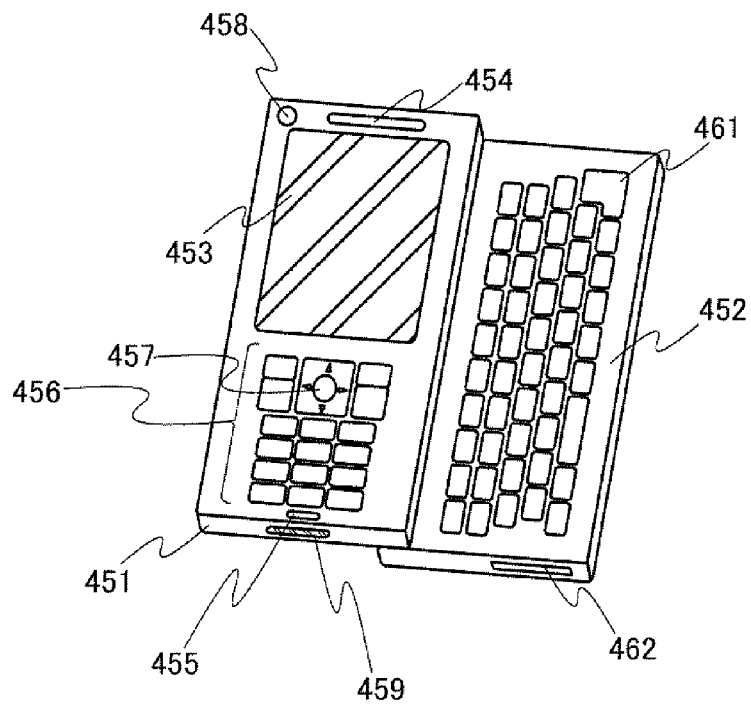

FIGS. 17A to 17C illustrate an example of a cellular phone; FIG. 17A is a front view, FIG. 17B is a rear view, and FIG. 17C is a front view in which two housings are slid. The cellular phone includes two housings 451 and 452. The cellular phone is a so-called smartphone which has both functions of a cellular phone and a portable information terminal, and incorporates a computer and can process a variety of data processing in addition to voice calls.

The housing 451 includes a display portion 453, a speaker 454, a microphone 455, operation keys 456, a pointing device 457, a front camera lens 458, an external connection terminal jack 459, an earphone terminal 460, and the like, while the housing 452 includes a keyboard 461, an external memory slot 462, rear camera 463, a light 465, and the like. An antenna is incorporated in the housing 451.

In addition to the above-described structure, a wireless IC chip, a small size memory device, or the like may be incorporated in the cellular phone.

The housings 451 and 452 which are put together to be lapped with each other (illustrated in FIG. 17A) can be developed by sliding as illustrated in FIG. 17C. The display panel or display device manufactured by any of the manufacturing methods of a display device described in Embodiments 1 to 3 can be incorporated in the display portion 453. Since the front camera lens 4508 is provided in the same plane as the display portion 453, the cellular phone can be used as a videophone. Further, a still image and a moving image can be taken with the rear camera 713 and the light 714, by using the display portion 703 as a viewfinder.

By using the speaker 454 and the microphone 455, the cellular phone can be used as an audio recording device (sound recorder) or an audio reproducing device. With the use of the operation keys 456, operation of incoming and outgoing calls, simple information input for electronic mail or the like, scrolling of a screen displayed on the display portion, cursor motion for selecting information displayed on the display portion, and the like are possible.

In the case where much information needs to be handled, such as the case of creating documents and using the mobile phone as a portable information terminal, the use of the keyboard 461 is convenient. Further, by sliding the housings 451 and 452 which overlap with each other (see FIG. 17A), the housings 451 and 452 can be spread as illustrated in FIG. 17C. In the case of using the cellular phone as a portable information terminal, a cursor can be moved smoothly with the use of the keyboard 461 and the pointing device 457. The external connection terminal jack 459 for an external connection terminal can be connected to various cables such as an AC adapter or a USB cable, whereby the mobile phone can be charged or can perform data communication with a personal computer or the like. Further, by inserting a recording medium in the external memory slot 462, a larger amount of data can be stored and moved.

The rear surface of the housing 452 (FIG. 17B) is provided with the rear camera 463 and the light 464, and a still image and a moving image can be taken using the display portion 453 as a viewfinder.

Note that the mobile phone may have an infrared communication function, a USB port, a function of receiving one segment television broadcast, a wireless IC chip, an earphone jack, or the like, in addition to the above-described functions and structures.

As described above, the invention disclosed in Embodiments 1 to 3 can be applied to a variety of electronic appliances.

This application is based on Japanese Patent Application serial no. 2009-055878 filed with Japan Patent Office on Mar. 10, 2009, the entire contents of which are hereby incorporated by reference.

What is claimed is:

1. A method for manufacturing a thin film transistor comprising:
   forming a silicon nitride layer;
   exposing the silicon nitride layer to an air atmosphere;
   performing plasma treatment on the silicon nitride layer by using argon gas plasma; and
   after performing the plasma treatment, forming a semiconductor layer including crystal grains over the silicon nitride layer,
   wherein the silicon nitride layer is formed in a first chamber of a multi-chamber,
   wherein the semiconductor layer is formed in a second chamber of the multi-chamber, and
   wherein the first chamber and the second chamber can be connected with each other in a vacuum state.

2. The method for manufacturing a thin film transistor according to claim 1, wherein the silicon nitride layer is a gate insulating layer.

3. The method for manufacturing a thin film transistor according to claim 1, wherein the thin film transistor is incorporated into one selected from the group consisting of an electronic book device, a digital photo frame, a television set, and a cellular phone.

4. The method for manufacturing a thin film transistor according to claim 1, wherein the silicon nitride layer is exposed to the air atmosphere for two seconds or more and ten minutes or less.

5. The method for manufacturing a thin film transistor according to claim 1, wherein the silicon nitride layer is formed by a CVD method.

6. The method for manufacturing a thin film transistor according to claim 1, wherein the silicon nitride layer is formed by a sputtering method.

7. The method for manufacturing a thin film transistor according to claim 1, wherein the silicon nitride layer is formed by a plasma CVD method.

8. The method for manufacturing a thin film transistor according to claim 1, wherein the silicon nitride layer is formed by a plasma CVD method using a frequency of 1 GHz or higher.

9. A thin film transistor comprising:
   a gate insulating layer at least an uppermost surface of which is a silicon nitride layer;
   a semiconductor layer including crystal grains provided over the gate insulating layer; and
   a buffer layer over the semiconductor layer,
   wherein a concentration of nitrogen of a part of the semiconductor layer is lower than a concentration of nitrogen of the buffer layer,
   wherein the part of the semiconductor layer exists in a vicinity of an interface between the semiconductor layer and the gate insulating layer,
   wherein the concentration of nitrogen of the part of the semiconductor layer is lower than a concentration of nitrogen of another part of the semiconductor layer.

10. The thin film transistor according to claim 9, wherein the part of the semiconductor layer exists in a region located at a height of 5 nm or more and 50 nm or less from the interface.

11. The thin film transistor according to claim 9, wherein the concentration of nitrogen of the part of the semiconductor layer is lower than $1\times10^{19}$ /cm$^3$.

12. The thin film transistor according to claim 9, wherein the thin film transistor is incorporated into one selected from the group consisting of an electronic book device, a digital photo frame, a television set, and a cellular phone.

13. The thin film transistor according to claim 9, wherein the buffer layer comprises another semiconductor layer.

14. The thin film transistor according to claim 13, wherein the another semiconductor layer includes an NH group.

15. The thin film transistor according to claim 13, wherein the another semiconductor layer includes an NH$_2$ group.

16. The thin film transistor according to claim 13, further comprising a source region provided over the another semiconductor layer.

17. The thin film transistor according to claim 13, further comprising a drain region provided over the another semiconductor layer.

* * * * *